United States Patent [19]

Miyake

[11] Patent Number: 5,623,221
[45] Date of Patent: Apr. 22, 1997

[54] LOW NOISE MOSFET EMPLOYING SELECTIVE DRIVE SIGNALS

[75] Inventor: Jun Miyake, Musashino, Japan

[73] Assignee: Hitachi, Ltd., Tokyo, Japan

[21] Appl. No.: 430,292

[22] Filed: Apr. 28, 1995

Related U.S. Application Data

[63] Continuation of Ser. No. 15,417, Feb. 9, 1993, abandoned.

[30] Foreign Application Priority Data

Feb. 28, 1992 [JP] Japan ................... 4-078419

[51] Int. Cl.⁶ ............... H03K 17/04; H03K 19/094
[52] U.S. Cl. .......... 327/108; 327/437; 327/384; 327/392; 327/398; 326/27; 326/58
[58] Field of Search .................. 307/270, 579, 307/451, 443, 596, 542, 547, 548, 594, 296.4, 296.5; 327/384, 387, 392, 398, 409, 410, 108, 112, 437, 111; 326/82, 58, 87, 27

[56] References Cited

U.S. PATENT DOCUMENTS

| | | | |
|---|---|---|---|
| 4,612,466 | 9/1986 | Stewart | 307/579 |
| 4,857,770 | 8/1989 | Partovi et al. | 326/58 |
| 4,961,010 | 10/1990 | Davis | 307/596 |
| 4,983,860 | 1/1991 | Yim et al. | 307/220 |
| 5,121,011 | 6/1992 | Ohya et al. | 307/220 |
| 5,144,163 | 9/1992 | Matsuzawa et al. | 307/443 |
| 5,166,551 | 11/1992 | Kamuro | 307/443 |

FOREIGN PATENT DOCUMENTS 1-128291  5/1989  Japan .

*Primary Examiner*—Timothy P. Callahan
*Assistant Examiner*—Dinh Le
*Attorney, Agent, or Firm*—Fay Sharpe Beall Fagan Minnich & McKee

[57] ABSTRACT

In a driving circuit for generating driving signals for controlling and switching on and off a first output element employed in an output circuit for generating a high-level output signal and a second output element employed in the output circuit for generating a low-level output signal in a mutually complementary manner, the conductance of the driving circuit is controlled so that it increases gradually with the lapse of time. By sequentially controlling the conductance of the driving circuit for generating the driving signals, the rates of change of the driving signals can be controlled in a smooth and stable manner and output currents can thus be changed smoothly to result in high-speed operation of an output signal with a reduced amount of noise.

18 Claims, 8 Drawing Sheets

LOW NOISE MOSFET EMPLOYING SELECTIVE DRIVE SIGNALS

This is a file-wrapper continuation of application Ser. No. 08/015,417 filed on Feb. 9, 1993, and now abandoned.

BACKGROUND OF THE INVENTION

The present invention relates to a semiconductor integrated-circuit device. In particular, the present invention relates to an effective technology applied to a semiconductor memory device including a plurality of output circuits which are put in an operating state at the same time.

An example of the semiconductor integrated-circuit device having output circuits which can reduce output noise while preventing through current from flowing is disclosed in Japanese Patent Laid-open No. 1-128291.

SUMMARY OF THE INVENTION

The inventors of the present invention conducted a study, discovering a phenomenon that in the output circuit cited above, the rising and falling of an output signal are to some extent affected with ease by an actual load capacity at the implementation substrate on which the semiconductor integrated-circuit device is created. This is because, in the case of typical two output MOSFETs turned on at different times, the rise and fall times of the output signal are dependent from time to time on a time constant which is, in turn, determined by the conductance of the turned-on MOSFET and its load capacitance. To be more specific, in the case of a circuit having a small load capacitance, the rise and fall times are short, being prone to ringing even if the output MOSFET actuated first is created to give a small conductance. In the case of a circuit with a large load capacitance, on the other hand, the rise and fall times of the output signal become relatively long, inadvertently slowing down its operation.

It is an object of the present invention to provide a semiconductor integrated-circuit device with an output circuit implementing high integration and output-noise reduction.

It is another object of the present invention to provide a semiconductor integrated-circuit device which implements high-speed operation while decreasing output noise without being affected by the load capacitance.

Hereafter, the objects of the present invention described above and its other objects as well as new features will become apparent from the following detailed description of embodiments with reference to accompanying diagrams.

The outline of a representative innovation of the present invention disclosed in this specification is briefly described as follows. An output-stage circuit comprises a first output element for generating a high-level output signal and a second output element for generating a low-level output signal. The first and second output elements are connected to each other in series. A driving circuit generates driving signals for controlling the first and second output elements of the output-stage circuit in order to switch them on and off in a mutually complementary manner. The conductance of the driving circuit is controlled so as to gradually increase its value with the lapse of time.

As described above, the present invention provides a means embracing sequential control of the conductance of a driving circuit for generating a driving signal, whereby the rate of change of the driving signal can be controlled gradually with a high degree of stability. Accordingly, the output current can also be changed gradually in accordance with the rate of change of the driving signal. As a result, the present invention provides a highly integrated semiconductor device which has high-speed operation producing only low output noise without being affected by the load capacitance.

DESCRIPTION OF THE PREFERRED EMBODIMENTS

Figure 1:
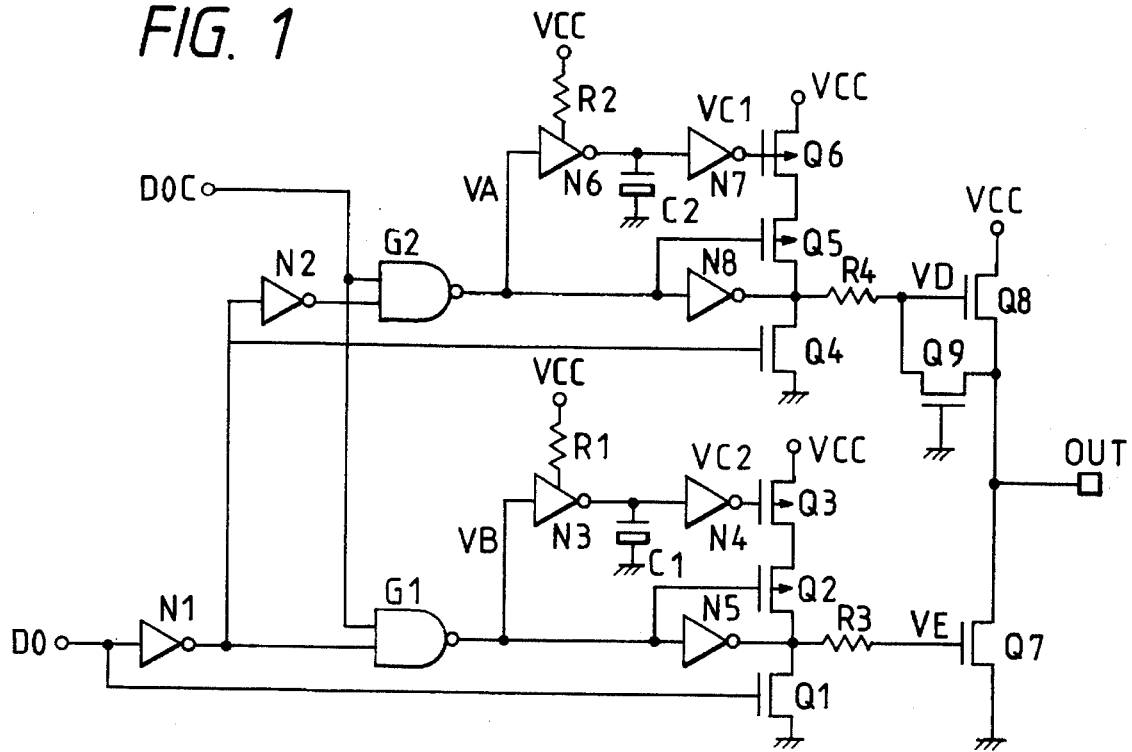
FIG. 1 is a circuit diagram of an embodiment implementing an output circuit of a semiconductor integrated-circuit device in accordance with the present invention.

FIG. 1 is a circuit diagram of an embodiment implementing an output circuit of a semiconductor integrated-circuit device in accordance with the present invention. Each of circuit elements shown in the figure is created on a piece of a semiconductor substrate typically made of single-crystal silicon along with other circuits which are not shown in the figure. In the figure, a P-channel MOSFET is distinguished from an N-channel MOSFET by appending an arrow on the channel portion (the package portion) of the transistor. This method of distinguishing a P-channel MOSFET from an N-channel MOSFET is used in other figures that follow FIG. 1.

An output circuit of the embodiment is designed to display a tri-state output function. It should be noted, however, that the semiconductor integrated-circuit device provided by the present invention is not particularly limited to such a configuration, wherein its output circuit has a tri-state output function. Data DO generated and output by an internal logic or memory circuit not shown in the figure is supplied to one input terminal of a NAND gate circuit G1 through a CMOS inverter circuit N1. The output signal of the CMOS inverter circuit N1 is supplied to one input terminal of a NAND gate circuit G2 through a CMOS inverter circuit N2. The other input terminals of the NAND gate circuits G1 and G2 are supplied with an output enable signal DOC for activating the output circuit.

The drain of an N-channel output MOSFET Q8 for driving a high-level output signal is connected to a power-supply voltage VCC whereas its source is tied to an output terminal OUT. An N-channel output MOSFET Q7 for driving a low-level output signal is provided, forming a series connection with the N-channel output MOSFET Q8. The drain of the N-channel output MOSFET Q7 is connected to the output terminal OUT whereas its source is connected to the ground potential of the circuit.

As the output circuit is activated by the output enable signal DOC, driving circuits to be described later control the output MOSFETs Q7 and Q8 in accordance with the value of the data DO to be output, switching the MOSFETs Q7 and Q8 on and off in a mutually complementary manner. In the case of this embodiment, with the lapse of time, the driving circuits gradually change control signals supplied to the gates of the output MOSFETS Q7 and Q8. In this way, noise which is generated when a low or high-level output signal is produced is reduced.

A resistor R3 is connected to the gate of the output MOSFET Q7. The resistor R3 and the gate capacitance of the output MOSFET Q7 form a time-constant circuit. The time constant of the time-constant circuit is fixed regardless of the load connected to the output terminal OUT. The time-constant circuit, the time constant of which is independent of the output load, is connected to one of the driving circuits whose conductance gradually varies with the lapse of time. That is to say, the output MOSFET Q7 for generating a low-level output signal is provided with a driving circuit comprising a CMOS inverter circuit N5, an N-channel MOSFET Q1 and P-channel MOSFETs Q2 and Q3.

The MOSFETs Q1 to Q3 constitute a sort of inverter circuit. In order to reduce the amounts of through currents at the driving and output stages, the MOSFETs Q1 to Q3 are interconnected to form the following configuration. The data DO is supplied directly to the gate of the N-channel MOSFET Q1. Accordingly, when the data DO goes low, the N-channel MOSFET Q1 is turned off immediately. With the data DO set at a low level, the output signal of the CMOS inverter circuit N1 goes high. In this state, setting the output enable signal DOC at a high level causes a signal VB output by the NAND gate circuit G1 to go low, turning on a P-channel MOSFET of the CMOS inverter circuit N5. It should be noted, however, that since the N-channel MOSFET Q1 has already been turned off, a direct current is by no means consumed through the P-channel MOSFET of the CMOS inverter circuit N5 and the N-channel MOSFET Q1 even if the P-channel MOSFET of the CMOS inverter circuit N5 is turned on.

The signal VB output by the NAND gate circuit G1 is supplied to a CMOS inverter circuit N3 whose rise time from a low level to a high level is lengthened because the CMOS inverter circuit N3 is driven by the operation voltage VCC through a resistor R1. A delay capacitor C1 is connected to the output terminal of the CMOS inverter circuit N3. In other words, when the signal VB supplied to the CMOS inverter circuit N3 changes from the high level to the low level, the signal output by the inverter circuit N3 is raised from the low level to the high level over a rise time prolonged by the resistor R1 in conjunction with a P-channel MOSFET of the CMOS inverter circuit N3 and the capacitor C1. The output signal of the CMOS inverter circuit N3 delayed in this way is supplied to the gate of the P-channel MOSFET Q3 as an input signal VC2 through a CMOS inverter circuit N4. The signal VB output by the NAND gate circuit G1 is supplied directly to the gate of the P-channel MOSFET Q2 which is connected in series to the P-channel MOSFET Q3. Accordingly, when the signal VB output by the NAND gate circuit G1 goes low, the P-channel MOSFET Q2 is turned on but the turning-on of the P-channel MOSFET Q3 lags behind that of the MOSFET Q2 because the signal VC2 supplied to the gate of the P-channel MOSFET Q3 by the CMOS inverter circuit N4 is delayed by a delay circuit introducing the prolonged rise time as described above.

The output MOSFET Q7 is turned on by the driving circuit described above as follows. A gate voltage VE is raised by a circuit which comprises the P-channel MOSFET of the CMOS inverter circuit N5 and the resistor R3 connected to the capacitance of the gate of the output MOSFET Q7. Since the P-channel MOSFET of the CMOS inverter circuit N5 has a small conductance, the time constant of the circuit has a relatively large value. At a first stage, the gate voltage VE is therefore raised gradually. After the time delay determined by the delay circuit described above has lapsed, however, the P-channel MOSFET Q3 is also turned on, resulting in a parallel connection of conductances in conjunction with the P-channel MOSFET Q2. The conductances connected in parallel are added to that of the P-channel MOSFET of the CMOS inverter circuit N5 to give an even larger total conductance, shortening the rise time of the gate voltage VE.

Much like the output MOSFET Q7, the gate of the output MOSFET Q8 for generating a high-level output signal is connected to a resistor R4 which forms a time-constant circuit in conjunction with the gate capacitance of the output MOSFET Q8. The value of the time constant of the circuit is fixed regardless of the load connected to the output terminal OUT. The time-constant circuit, the time constant of which is independent of the output load, is connected to the other driving circuit whose conductance also gradually varies with the lapse of time. That is to say, the output MOSFET Q8 for generating a high-level output signal is provided with a driving circuit comprising a CMOS inverter circuit N8, an N-channel MOSFET Q4 and P-channel MOSFETs Q5 and Q6.

The MOSFETs Q4 to Q6 constitute a sort of inverter circuit. In order to reduce the amounts of through currents at the driving and output stages, the MOSFETs Q4 to Q6 are connected to each other to form the following configuration. The data DO is supplied to the CMOS inverter circuit N1 whose output is connected to the gate of the N-channel MOSFET Q4. Accordingly, when the data DO goes high, the output of the CMOS inverter circuit N1 is set to a low level, turning off the N-channel MOSFET Q4 immediately. With the data DO set at a high level, a signal output by the CMOS inverter circuit N1 goes low but a signal output by the CMOS inverter N2 goes high. In this state, setting the output enable signal DOC at a high level causes a signal VA output by the NAND gate circuit G2 to go low, turning on a P-channel MOSFET of the CMOS inverter circuit N8. It should be noted, however, that since the N-channel MOSFET Q4 has already been turned off, a direct current is by no means consumed through the P-channel MOSFET of the CMOS inverter circuit N8 and the N-channel MOSFET Q4 even if the P-channel MOSFET of the CMOS inverter circuit N8 is turned on.

The signal VA output by the NAND gate circuit G2 is supplied to a CMOS inverter circuit N6 whose rise time from a low level to a high level is lengthened because the CMOS inverter circuit N6 is driven by the operation voltage VCC through a resistor R2. A delay capacitor C2 is connected to the output terminal of the CMOS inverter circuit N6. In other words, when the signal VA supplied to the CMOS inverter circuit N6 changes from the high level to the low level, the signal output by the inverter N6 is raised from the low level to the high level over a rise time prolonged by the resistor R2 in conjunction with a P-channel MOSFET of the CMOS inverter circuit N6 and the capacitor C2. The output signal of the CMOS inverter circuit N6 delayed in this way is supplied to the gate of the P-channel MOSFET Q6 as an input signal VC1 through a CMOS inverter circuit N7. The signal VA output by the NAND gate circuit G2 is supplied directly to the gate of the P-channel MOSFET Q5 which is connected in series to the P-channel MOSFET Q6. Accordingly, when the signal VA output by the NAND gate circuit G2 goes low, the P-channel MOSFET Q5 is turned on but the turning-on of the P-channel MOSFET Q6 lags behind that of the MOSFET Q5 because the signal VC1 supplied to the gate of the P-channel MOS Q6 by the CMOS inverter circuit N7 is delayed by a delay circuit described above.

The output MOSFET Q8 is turned on by the driving circuit described above as follows. A gate voltage VD is raised by a circuit which comprises the P-channel MOSFET of the CMOS inverter circuit N8 and the resistor R4 connected to the capacitance of the gate of the output MOSFET Q8. Since the P-channel MOSFET of the CMOS inverter circuit N8 has a small conductance, the time constant of the circuit has a relatively large value. At a first stage, the gate voltage VD is therefore raised gradually. After the time delay determined by the delay circuit described above has lapsed, however, the P-channel MOSFET Q6 is also turned on, resulting in a parallel connection of conductances in conjunction with the P-channel MOSFET Q5. The conductances connected in parallel are added to that of the P-channel MOSFET of the CMOS inverter circuit N8 to give an even larger total conductance, shortening the rise time of the gate voltage VD.

As described above, the output MOSFET Q7 is turned off before the output MOSFET Q8 is turned on by the data DO set at a high level. With the data DO set at a high level, the MOSFET Q1 at the driving stage enters an on state, pulling down the gate voltage VE of the output MOSFET Q7 to a low level at an early stage. At that time, the signal VB output by the gate circuit G1 changes to a low level, turning off the P-channel MOSFET Q2 with fast timing. Therefore, the direct current supplied through a series circuit comprising the P-channel MOSFETs Q3 and Q2 is cut off even if the P-channel MOSFET Q3 is kept in the on state till a later time by the delay circuit described earlier. As a result, the fail time of the driving voltage VE can be shortened. In addition, the through current flowing through the MOSFETs Q1 to Q3 and the through current flowing through the MOSFETs Q2 and Q3 and the N-channel MOSFET of the CMOS inverter circuit N5 can also be prevented as well.

Similarly, when the output MOSFET Q7 is switched from an off state to an on state by the data DO set at a low level, the output MOSFET Q8 is turned off. Receiving the data DO set at a low level, the the signal output by the CMOS inverter circuit N1 turns high, causing the MOSFET Q4 at the driving stage to enter an on state and, hence, pulling down the gate voltage VD of the output MOSFET Q8 to a low level at a relatively early stage. At that time, the signal VA output by the gate circuit G2 changes to a low level, turning off the P-channel MOSFET Q5 with fast timing. Therefore, the direct current supplied through a series circuit comprising the P-channel MOSFETs Q6 and Q5 is cut off even if the P-channel MOSFET Q6 is kept in the on state till a later time by the delay circuit described earlier. As a result, the fall time of the driving voltage VD can be shortened. In addition, the through current flowing through the MOSFETs Q4 to Q6 and the through current flowing through the MOSFETs Q5 and Q6 and the N-channel MOSFET of the CMOS inverter circuit N8 can also be prevented as well.

In this embodiment, an N-channel MOSFET Q9 is connected between the gate and the source of the output MOSFET Q8 for generating a high-level output signal. The gate of the N-channel MOSFET Q9 is kept permanently at the ground potential of the circuit. Accordingly, the N-channel MOSFET Q9 is normally in the off state. When the output MOSFET Q7 is turned on, an undershoot occurs in the output signal, pulling the output terminal OUT to a negative potential. If the absolute value of the negative potential exceeds the voltage threshold value of the output MOSFET Q8, the MOSFET Q8 which should be sustained in an off state is inadvertently turned on, giving rise to an effect of generating noise on power supply wires and the output terminal OUT. Fortunately, however, the N-channel MOSFET Q9 is turned on by the undershooting output signal, putting the gate and the source of the output MOSFET Q8 in a short-circuit state. As a result, the output MOSFET Q8 can be kept in the off state as it is.

Figure 2:
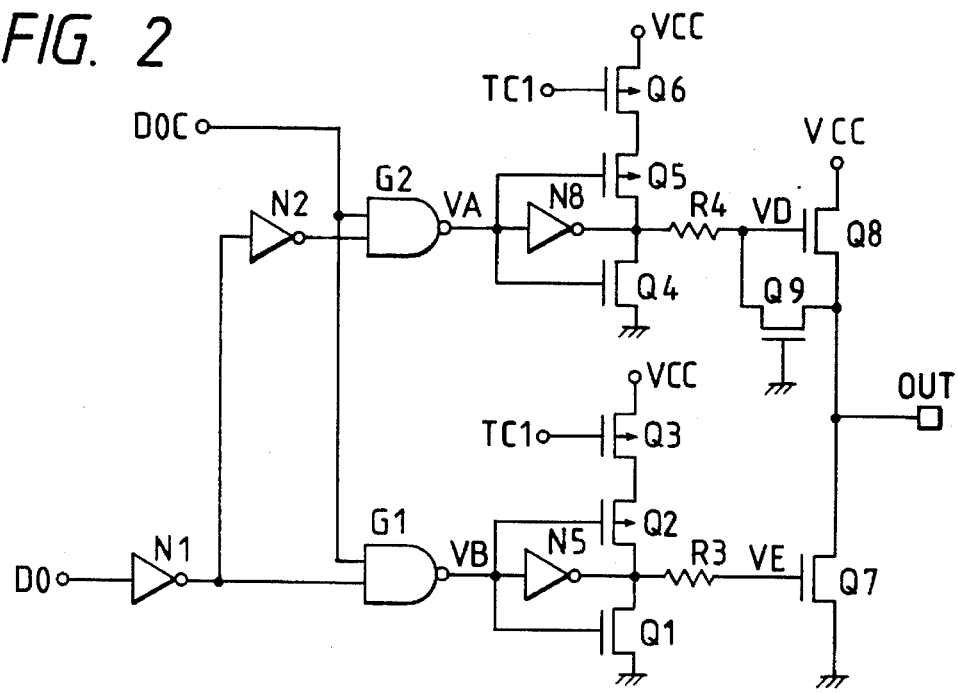
FIG. 2 is a circuit diagram of another embodiment implementing the output circuit of a semiconductor integrated-circuit device in accordance with the present invention.

FIG. 2 is a circuit diagram of another embodiment implementing the output circuit of a semiconductor integrated-circuit device in accordance with the present invention. The embodiment is suitable for a circuit that outputs data DO in synchronization with a predetermined timing signal. In the case of data DO output in synchronization with an appropriate timing signal such as internal clock pulses, the timing signal is properly delayed and then supplied to a logic circuit along with the data DO to give timing signals TC1 and TC2 equivalent to the delayed signals VC1 and VC2 produced by the the delay circuits employed in the embodiment shown in FIG. 1. The timing signals TC1 and TC2 generated in this way are supplied to the gates of P-channel MOSFETs Q6 and Q3 respectively. In a configuration comprising a plurality of output circuits, it is not necessary to provide each output circuit individually with a delay circuit such as the case with the embodiment shown in FIG. 1. Instead, a single timing generation circuit common to all the output circuits can be employed. In this case, the delay circuit can be designed into a simple configuration by combining gate circuits to form logic, whereby a timing signal produced by the common timing generation circuit and the data (DO) generated by the output circuits are manipulated.

Figure 3:
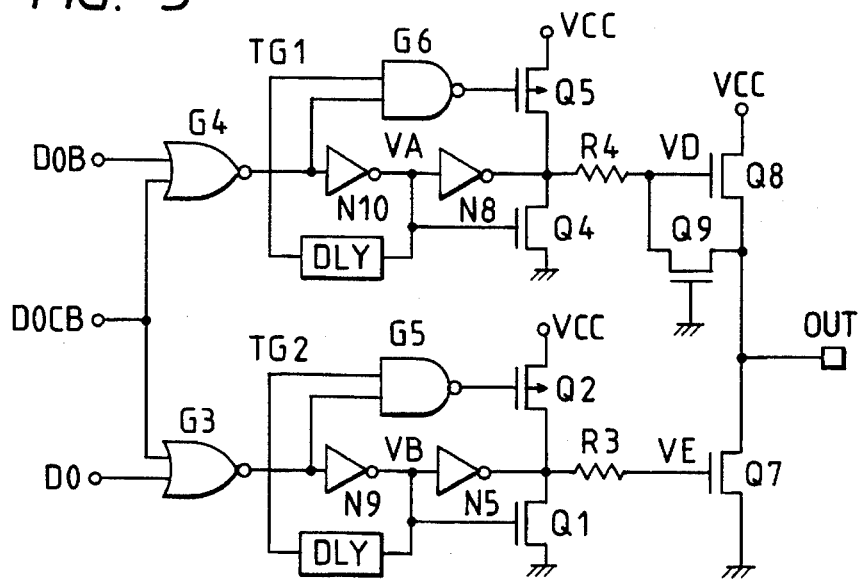
FIG. 3 is a circuit diagram of yet another embodiment implementing the output circuit of a semiconductor integrated-circuit device in accordance with the present invention.

FIG. 3 is a circuit diagram of yet another embodiment implementing the output circuit of a semiconductor integrated-circuit device in accordance with the present invention. In this embodiment, only one P-channel MOSFET Q2 is utilized in conjunction with a CMOS inverter circuit N5 for generating a signal VE for driving the gate of an output MOSFET Q7. In this configuration, the P-channel MOSFET Q2 increases a delayed conductance for a driving current supplied to the gate of an output MOSFET Q7 at a driving-stage. In order to make the turning-on of the P-channel MOSFET Q2 lag behind that of a P-channel MOSFET of the CMOS inverter circuit N5, a NAND gate circuit G5 is employed. A delayed signal TG2 lagging behind an input signal VB and a signal output by a NOR gate circuit G3 are supplied to the input terminals of the NAND gate circuit G5. The NOR gate circuit G3 is, in turn, controlled by an output enable signal DOCB, an active-low signal. Data DO is taken in by the NOR gate circuit G3. A signal output by the NOR gate circuit G3 is supplied to the CMOS inverter circuit N5 as the input signal VB cited above through an inverter circuit N9.

Similarly, only one P-channel MOSFET Q5 is used in conjunction with a CMOS inverter circuit N8 for generating a signal VD for driving the gate of an output MOSFET Q8. In this configuration, the P-channel MOSFET Q5 increases a delayed conductance for a driving current supplied to the gate of the output MOSFET Q8 at a driving stage. In order to make the turning-on of the P-channel MOSFET Q5 lag behind that of a P-channel MOSFET of the CMOS inverter circuit N8, a NAND gate circuit G6 is employed. A delayed signal TG1 lagging behind an input signal VA and a signal output by a NOR gate circuit G4 are supplied to the input terminals of the NAND gate circuit G6. The NOR gate circuit G4 is, in turn, controlled by the output enable signal DOCB, an active-low signal. Data DOB, also an active-low signal, is taken in by the NOR gate circuit G4. A signal output by the NOR gate circuit G4 is supplied to the CMOS inverter circuit N8 as the input signal VA cited above through an inverter circuit N10.

Basically, the operation of this circuit is the same as that of the embodiment shown in FIG. 1. In the case of this circuit, however, since only one P-channel MOSFET is employed for increasing the delayed conductance, delay circuits DLY and the NAND gate circuits G5 and G6 are utilized. The delay circuits DLY delay the signals TG2 and TG1 with respect to the input signals VB and VA respectively as described above. In order to implement a tri-state output function, the NOR gate circuits are incorporated in the configuration of the gate circuits. It should be noted, however, that NAND gate circuits can also be used instead. Nevertheless, by employing the NOR gate circuits, only few inverter circuits can be used for turning on the P-channel MOSFETs Q2 and Q5 with delayed timing with respect to changes in the data signals DO or DOB and turning off them with fast timing with respect to changes in the data signals DO or DOB.

Figure 4:
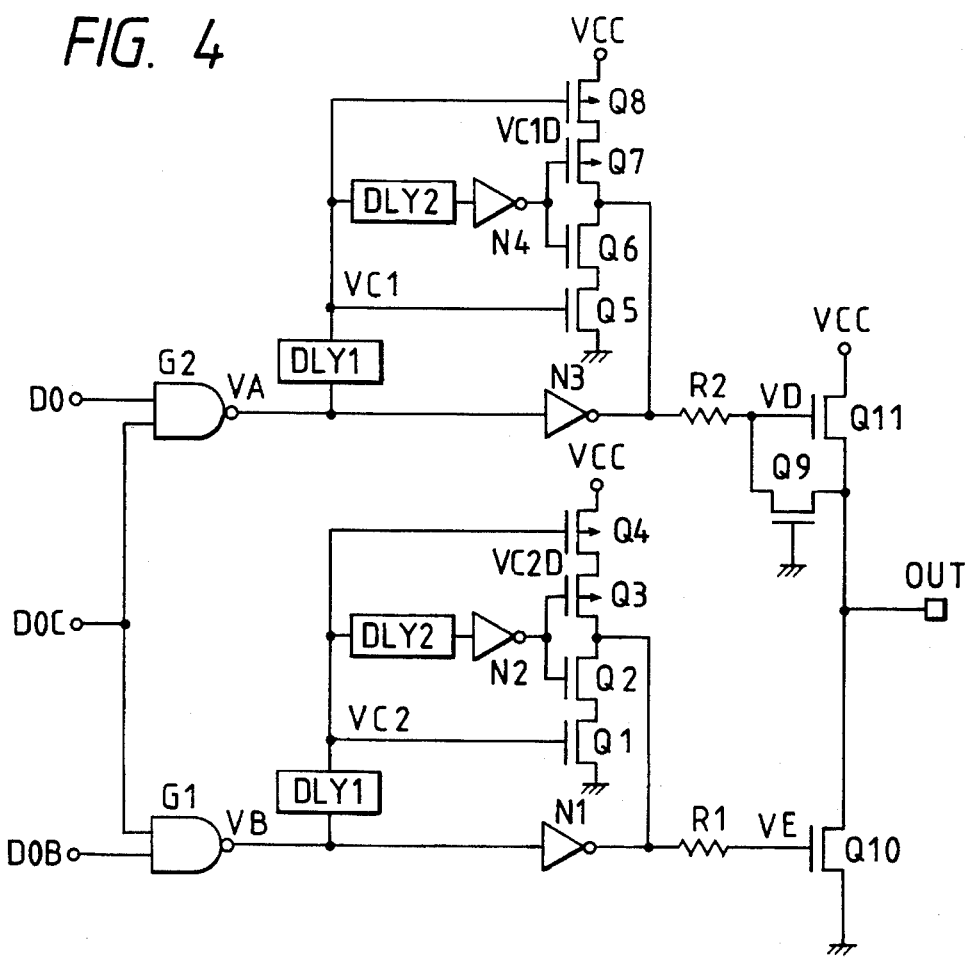
FIG. 4 is a circuit diagram of still another embodiment implementing the output circuit of a semiconductor integrated-circuit device in accordance with the present invention.

FIG. 4 is a circuit diagram of still another embodiment implementing the output circuit of a semiconductor integrated-circuit device in accordance with the present invention. The same symbols as those shown in FIGS. 1 to 3 are used for denoting some circuit elements shown in FIG. 4 only for the sake of clarity. Even though the symbols are the same, the circuit elements denoted thereby have different functions.

In this embodiment, an input resistor R1 is connected to the gate of an output MOSFET Q10 for generating a low-level output signal. A driver for driving the output MOSFET Q10 provided with such an input resistor comprises a CMOS inverter circuit N1 and MOSFETs Q1 to Q4 which, in essence, form a CMOS inverter circuit. As shown in the figure, the N-channel MOSFETs Q1 and Q2 and the P-channel MOSFETs Q3 and Q4 are connected in series. A signal VC2 delayed after a signal VB by a delay circuit DLY1 is supplied to the gates of the N-channel MOSFET Q1 and the P-channel MOSFET Q4. A signal VC2D delayed after the signal VC2 by a delay circuit DLY2 and then inverted by an inverter circuit N2 is supplied to the gates of the N-channel MOSFET Q2 and the P-channel MOSFET Q3.

Controlled by an output enable signal DOC, a NAND gate circuit G1 propagates data DOB to be output as in the case with the embodiment shown in FIG. 3. The data DOB, an inverted signal of data DO, is obtained by supplying the data DO to an inverter circuit which is not shown in the figure.

With the output enable signal DOC set at a high level, raising the data DOB to a high level causes the signal VB output by the NAND gate circuit G1 to go low, turning on a P-channel MOSFET of the CMOS inverter circuit N1. At the same time, a driving signal VE rises gradually. At that time, the delayed signal VC2D generated from the signal VB through the delay circuits DLY1 and DLY2 and the inverter circuit N2 remains at a low level on the gates of the P-channel MOSFET Q3 and the N-channel MOSFET Q2 as it is, keeping the P-channel MOSFET Q3 and the N-channel MOSFET Q2 in on and off states respectively. Accordingly, no direct current flows through the P-channel MOSFET of the CMOS inverter circuit N1 and the N-channel MOSFETs Q1 and Q2. As cited above, the driving signal VE rises gradually with a time constant determined by the conductance of the P-channel MOSFET of the CMOS inverter circuit N1, the resistor R1 and the gate capacitance of the output MOSFET Q10. As a result, in spite of the fact that the output MOSFET Q10 is formed to give a statically large conductance, the voltage of the output terminal OUT starts to drop to a low level gradually because the flow of the output current is being controlled by the gradual build-up of the driving signal VE.

After a delay time has lapsed since the signal VB output by the NAND gate circuit G1 was pulled down to a low level, the signal VC2 output by the delay circuit DLY1 also goes low, turning on the P-channel MOSFET Q4 but turning off the N-channel MOSFET Q1. Accordingly, the P-channel MOSFETs Q3 and Q4, which are at that time in an on state, form a parallel circuit in conjunction with the P-channel MOSFET of the CMOS inverter circuit N1, increasing their combined conductances. As a result, the rise time of the driving voltage VE is shortened.

On the other hand, after a delay time produced by the delay circuit DLY2 has lapsed or, in other words, when the output signal reaches a low-level voltage close to the ground potential of the circuit, lagging behind the turning-on of the P-channel MOSFET Q4 and the turning-off of the N-channel MOSFET Q1 described above, the delayed signal VC2D rises to a high level. The rising signal VC2D to the high level turns on the P-channel MOSFET Q2 but turns off the N-channel MOSFET Q3. Therefore, the driver comprising the MOSFETs Q1 to Q4 displays a high output impedance, virtually cutting off itself from the driving circuit for generating the driving voltage VE. In this state, the driving circuit is again restored to the original condition before the signal VC2 was pulled down to a low level in which case only the CMOS inverter circuit N1 drives the signal VE. As a result, the driving signal VE settles at a high-level voltage of the power supply VCC without overshooting. An undershoot can thus be prevented from occurring in the voltage produced at the output terminal OUT.

Similarly, an input resistor R2 is connected to the gate of an output MOSFET Q11 for generating a high-level output signal. A driver for driving the output MOSFET Q11 provided with such an input resistor comprises a CMOS inverter circuit N3 and MOSFETs Q5 to Q8 which, in essence, form a CMOS inverter circuit. As shown in the figure, the N-channel MOSFETs Q5 and Q6 and the P-channel MOSFETs Q7 and Q8 are connected in series. A signal VC1 delayed after a signal VA by a delay circuit DLY1 is supplied to the gates of the N-channel MOSFET Q5 and the P-channel MOSFET Q8. A signal VC1D delayed after the signal VC1 by a delay circuit DLY2 and then inverted by an inverter circuit N4 is supplied to the gates of the N-channel MOSFET Q6 and the P-channel MOSFET Q7.

Controlled by an output enable signal DOC, a NAND gate circuit G2 propagates the data DO to be output as in the case with the NAND gate circuit G1 described above. With the output enable signal DOC set at a high level, raising the data DO to a high level causes the signal VA output by the NAND gate circuit G2 to go low, turning on a P-channel MOSFET of the CMOS inverter circuit N3. At the same time, a driving signal VD rises gradually. At that time, the delayed signal VC1D generated from the signal VA through the delay circuits DLY1 and DLY2 and the inverter circuit N4 remains at a low level on the gates of the P-channel MOSFET Q7 and the N-channel MOSFET Q6 as it is, keeping the P-channel MOSFET Q7 and the N-channel MOSFET Q6 in on and off states respectively. Accordingly, no direct current flows through the P-channel MOSFET of the CMOS inverter circuit N3 and the N-channel MOSFETs Q5 and Q6. As cited above, the driving signal VD rises gradually with a time constant determined by the conductance of the P-channel MOSFET of the CMOS inverter circuit N3, the resistor R2 and the gate capacitance of the output MOSFET Q11. As a result, in spite of the fact that the output MOSFET Q11 is formed to give a statically large conductance, the voltage of the output terminal OUT starts to rise to a high level gradually because the flow of the output current is being controlled by the gradual build-up of the driving signal VD.

After a delay time has lapsed since the signal VA output by the NAND gate circuit G2 was pulled down to a low level, the signal VC1 output by the delay circuit DLY1 also goes low, turning on the P-channel MOSFET Q8 but turning off the N-channel MOSFET Q5. Accordingly, the P-channel MOSFETs Q7 and Q8, which are at that time in an on state, form a parallel circuit in conjunction with the P-channel MOSFET of the CMOS inverter circuit N3, increasing their combined conductances. As a result, the rise time of the driving voltage VD is shortened.

On the other hand, after a delay time produced by the delay circuit DLY2 has lapsed or, in other words, when the output signal reaches a high-level value close to the power-supply voltage VCC-Vth, lagging behind the turning-on of the P-channel MOSFET Q8 and the turning-off of the N-channel MOSFET Q5 described above, the delayed signal VC1D rises o a high level. Note that Vth is the value of the threshold voltage of the output MOSFET Q11. The rising signal VC1D to a high level turns off the P-channel MOSFET Q7 but turns on the N-channel MOSFET Q6. Therefore, the driver comprising the MOSFETs Q5 to Q8 displays a high output impedance, virtually cutting off itself from the driving circuit for generating the driving voltage VD. In this state, the driving circuit is again restored to the original condition before the signal VC1 was pulled down to a low level in which case only the CMOS inverter circuit N3 drives the signal VD. As a result, the driving signal VD settles at a high-level voltage of the power supply VCC without overshooting. An overshoot can thus be prevented from occurring in the voltage produced at the output terminal OUT.

Figure 5:
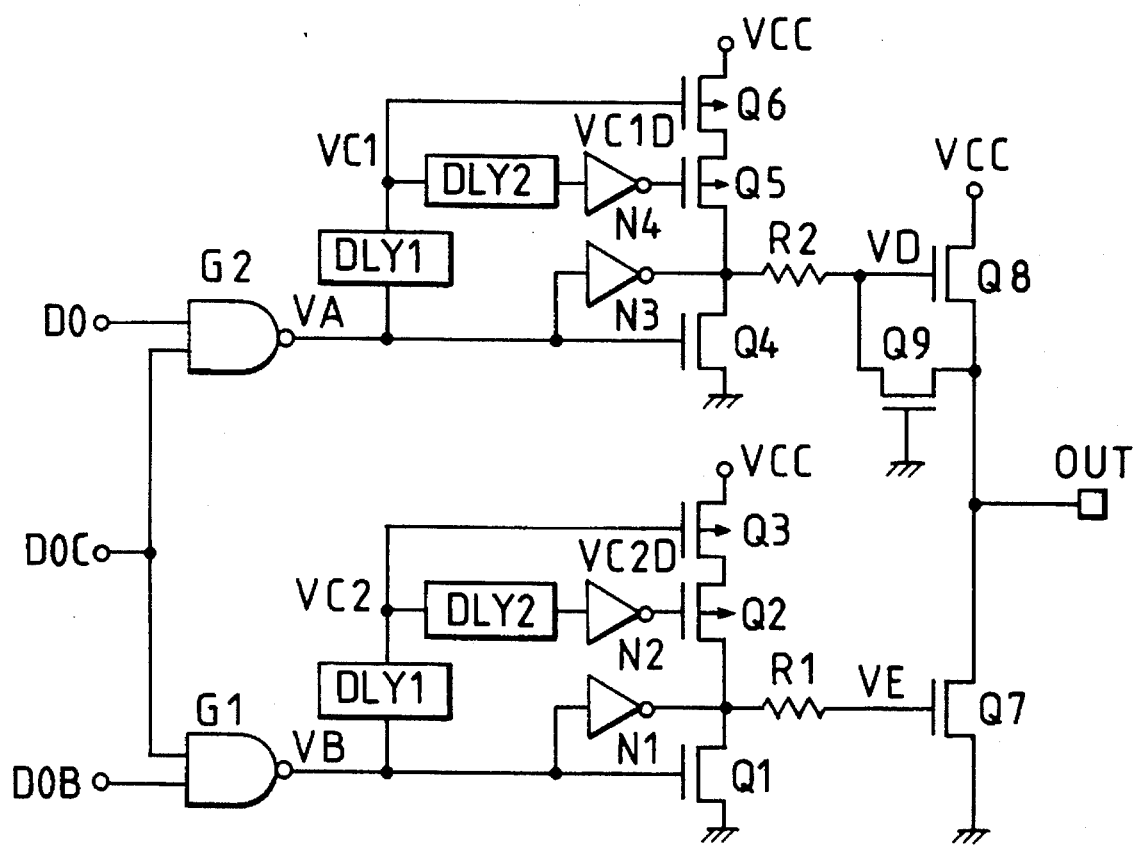
FIG. 5 is a circuit diagram of still further another embodiment implementing the output circuit of a semiconductor integrated-circuit device in accordance with the present invention.

FIG. 5 is a circuit diagram of still further another embodiment implementing the output circuit of a semiconductor integrated-circuit device in accordance with the present invention. Most of symbols shown in the figure, which are the same as those of FIG. 1, are used for denoting the same circuit elements. In this embodiment, an input resistor R1 is connected to the gate of an output MOSFET Q7 for generating a low-level output signal. A driver for driving the output MOSFET Q7 provided with such an input resistor comprises a CMOS inverter circuit N1 and MOSFETs Q1 to Q3 which, in essence, form a CMOS inverter circuit. As shown in the figure, the N-channel MOSFETs Q1 and the P-channel MOSFETS Q2 and Q3 are connected in series. A signal VB output by a NAND gate circuit G1 is supplied directly to the gate of the N-channel MOSFET Q1 in order to shorten the fall time of a driving signal VE as in the case of the embodiment shown in FIG. 1. A signal VC2 delayed after the signal VB by a delay circuit DLY1 is supplied to the gate of the P-channel MOSFET Q3. A signal VC2D delayed after the signal VC2 by a delay circuit DLY2 and then inverted by an inverter circuit N2 is supplied to the gate of the P-channel MOSFET Q2.

Controlled by an output enable signal DOC, a NAND gate circuit G1 propagates data DOB to be output as in the case with the embodiment shown in FIG. 4. The data DOB, an inverted signal of data DO, is obtained by supplying the data DO to an inverter circuit which is not shown in the figure.

With the output enable signal DOC set at a high level, raising the data DOB to a high level causes the signal VB output by the NAND gate circuit G1 to go low, turning on a P-channel MOSFET of the CMOS inverter circuit N1. At the same time, the driving signal VE rises gradually. With the signal VB pulled down to a low level, the N-channel MOSFET Q1 is in an off state, allowing no direct current to flow through the P-channel MOSFET of the CMOS inverter circuit N1 and the N-channel MOSFET Q1. With the delayed signal VC2 output by the the delay circuit DLY1 going high, the P-channel MOSFET Q3 is also turned off. On the other hand, the P-channel MOSFET Q2 is turned on by the signal VC2D delayed after the signal VC2 by a delay circuit DLY2 and then inverted by an inverter circuit N2. As cited above, the driving signal VE rises gradually with a time constant determined by the conductance of the P-channel MOSFET of the CMOS inverter circuit N1, the resistor R1 and the gate capacitance of the output MOSFET Q7. As a result, in spite of the fact that the output MOSFET Q7 is formed to give a statically large conductance, the voltage of the output terminal OUT starts to drop to a low level gradually because the flow of the output current is being controlled by the gradual build-up of the driving signal VE.

After a delay time has lapsed since the signal VB output by the NAND gate circuit G1 was pulled down to a low level, the signal VC2 output by the delay circuit DLY1 also goes low, turning on the P-channel MOSFET Q3. Accordingly, the P-channel MOSFETs Q2 and Q3, which are at that time in an on state, form a parallel circuit in conjunction with the P-channel MOSFET of the CMOS inverter circuit N1, increasing their combined conductances. As a result, the rise time of the driving voltage VE is shortened.

On the other hand, after a delay time produced by the delay circuit DLY2 has lapsed or, in other words, when the output signal reaches a low-level voltage close to the ground potential of the circuit, lagging behind the turning-on of the P-channel MOSFET Q3 described above, the delayed signal VC2D rises to a high level. The rising signal VC2D to a high level turns off the P-channel MOSFET Q2. In this state, the driving circuit is again restored to the original condition before the signal VC2 was pulled down to a low level in which case only the CMOS inverter circuit N1 drives the signal VE. As a result, the driving signal VE settles at a high-level voltage of the power supply VCC without overshooting. An undershoot can thus be prevented from occurring in the voltage produced at the output terminal OUT.

When the signal appearing at the output terminal OUT is pulled down to a low-level voltage or, in other words, when the output MOSFET Q7 is turned on, a signal VA output by a NAND gate circuit G2 goes high following the change of the data DO to a voltage at a low level. With the signal VA changing to a high-level voltage, an N-channel MOSFET Q4 is turned on, pulling down a driving signal VD, which has been so far kept at a high level, to a low-level voltage at a high speed in conjunction with the N-channel MOSFET of a CMOS inverter circuit N3. That is why an output MOSFET Q8 is turned off immediately as soon as the data DO changes to a low-level voltage as described above. As a result, through current flowing through the output MOSFETs Q8 and Q7 can be suppressed to a minimum.

Similarly, an input resistor R2 is connected to the gate of the output MOSFET Q8 for generating a low-level output signal. A driver for driving the output MOSFET Q8 provided with such an input resistor comprises a CMOS inverter circuit N3, the N-channel MOSFET Q4 and P-channel MOSFETs Q5 and Q6. The MOSFETs Q4 to Q6 in essence form a CMOS inverter circuit. As shown in the figure, the N-channel MOSFET Q4 and the P-channel MOSFETs Q5 and Q6 are connected in series. A signal VA output by a NAND gate circuit G1 is supplied directly to the gate of the N-channel MOSFET Q4 in order to shorten the fall time of a driving signal VD. A signal VC1 delayed after the signal VA by a delay circuit DLY1 is supplied to the gate of the P-channel MOSFET Q6. A signal VC1D delayed after the signal VC1 by a delay circuit DLY2 and then inverted by an inverter circuit N4 is supplied to the gate of the P-channel MOSFET Q5.

Controlled by an output enable signal DOC, the NAND gate circuit G2 propagates data DOB to be output as in the case with the embodiment shown in FIG. 4. With the output enable signal DOC set at a high level, raising the data DO to a high level causes the signal VA output by the NAND gate circuit G2 to go low, turning on the P-channel MOSFET of the CMOS inverter circuit N3. At the same time, the driving signal VD rises gradually. With the signal VA pulled down to a low level, the N-channel MOSFET Q4 is in an off state, allowing no direct current to flow through the P-channel MOSFET of the CMOS inverter circuit N3 and the N-channel MOSFET Q4. With the delayed signal VC1 output by the the delay circuit DLY1 going high, the P-channel MOSFET Q6 is also turned off. On the other hand, the P-channel MOSFET Q5 is turned on by the signal VC1D delayed after the signal VC1 by a delay circuit DLY2 and then inverted by an inverter circuit N4. As cited above, the driving signal VD rises gradually with a time constant determined by the conductance of the P-channel MOSFET of the CMOS inverter circuit N3, the resistor R2 and the gate capacitance of the output MOSFET Q8. As a result, in spite of the fact that the output MOSFET Q8 is formed to give a statically large conductance, the voltage of the output terminal OUT goes up to a high level while the flow of the output current is being controlled by the gradual build-up of the driving signal VD.

After a delay time has lapsed since the signal VA output by the NAND gate circuit G2 was pulled down to a low level, the signal VC1 output by the delay circuit DLY1 also goes low, turning on the P-channel MOSFET Q6. Accordingly, the P-channel MOSFETs Q5 and Q6, which are at that time in an on state, form a parallel circuit in conjunction with the P-channel MOSFET of the CMOS inverter circuit N3, increasing their combined conductances. As a result, the rise time of the driving voltage VD is shortened.

On the other hand, after a delay time produced by the delay circuit DLY2 has lapsed or, in other words, when the output signal reaches a low-level voltage close to the ground potential of the circuit, lagging behind the turning-on of the P-channel MOSFET Q6 described above, the delayed signal VC1D rises to a high level. The rising signal VC1D to a high level turns off the P-channel MOSFET Q5. In this state, the driving circuit is again restored to the original condition before the signal VC1 was pulled down to a low level in which case only the CMOS inverter circuit N3 drives the signal VD. As a result, the driving signal VD settles at a high-level voltage of the power supply VCC without overshooting. An overshoot can thus be prevented from occurring in the voltage produced at the output terminal OUT.

When the signal appearing at the output terminal OUT is raised to a high-level voltage as described above or, in other words, when the output MOSFET Q8 is turned on, the signal VB output by the NAND gate circuit G1 goes high following the change of the data DOB to a voltage at a low level. With the signal VB changing to a high-level voltage, an N-channel MOSFET Q1 is turned on, pulling down the driving signal VE, which has been so far kept at a high level, to a low-level voltage at a high speed in conjunction with the N-channel MOSFET of the CMOS inverter circuit N1. That is why the output MOSFET Q7 is turned off immediately as soon as the data DOB changes to a low-level voltage as described above. As a result, through current flowing through the output MOSFETs Q8 and Q7 can be suppressed to a minimum.

Figure 12:
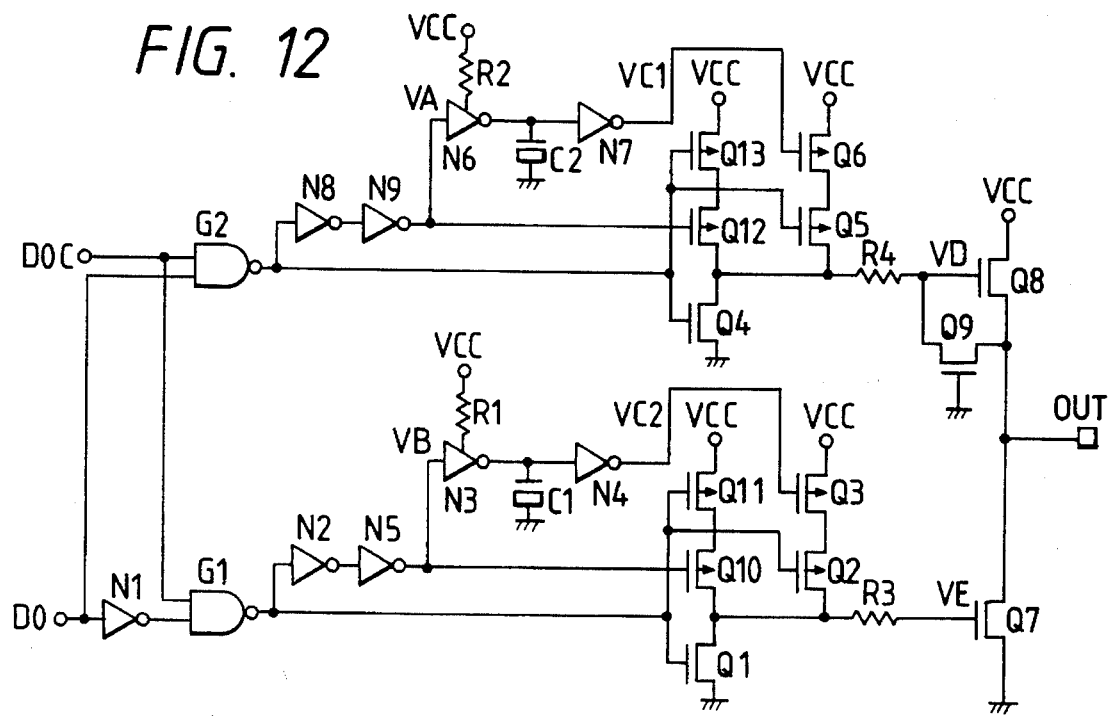
FIG. 12 is a circuit diagram of still another embodiment implementing the output circuit of a semiconductor integrated-circuit device in accordance with the present invention.

FIG. 12 is a circuit diagram of still another embodiment implementing the output circuit of a semiconductor integrated-circuit device in accordance with the present invention. The output circuit employed in this embodiment is designed to display a tri-state output function. Data DO to be output, which is generated by an internal logic circuit, memory circuit or the like not shown in the figure, is supplied to one input terminal of a NAND gate circuit G1 through a CMOS inverter circuit N1. The data DO is also fed to one terminal of another NAND gate circuit G2. An output enable signal DOC for activating the output circuit is supplied to the other input terminals of the NAND gate circuits G1 and G2.

The drain of an N-channel output MOSFET Q8 for driving a high-level output signal is connected to a power-supply voltage VCC whereas its source is tied to an output terminal OUT. An N-channel output MOSFET Q7 for driving a low-level output signal is provided, forming a series connection with the N-channel output MOSFET Q8. The drain of the N-channel output MOSFET Q7 is connected to the output terminal OUT whereas its source is connected to the ground potential of the circuit.

When the output circuit is activated by the output enable signal DOC, driving circuits to be described later control these output MOSFETs Q7 and Q8 in accordance with the data DO to be output, switching the MOSFETs Q7 and Q8 on and off in a mutually complementary manner. In the case of this embodiment, with the lapse of time, the driving circuits gradually change control signals supplied to the gates of the output MOSFETS Q7 and Q8. In this way, noise which is generated when a low or high-level output signal is produced can be reduced.

A resistor R3 is connected to the gate of the output MOSFET Q7. The resistor R3 and the gate capacitance of the output MOSFET Q7 form a time-constant circuit. The time constant of the time-constant circuit is fixed regardless of the load connected to the output terminal OUT. The time-constant circuit, the time constant of which is independent of the output load, is connected to one of the driving circuits whose conductance gradually varies with the lapse of time. That is to say, the output MOSFET Q7 for generating a low-level output signal is provided with a driving circuit comprising a CMOS inverter circuit N5, an N-channel MOSFET Q1 and P-channel MOSFETs Q2, Q3, Q10 and Q11.

In order to prevent through current from flowing through the MOSFETs Q1, Q2 and Q3 or the MOSFETs Q1, Q10 and Q11, they are connected in the following configuration. A signal output by the NAND gate circuit G1 is supplied to the gates of the N-channel MOSFET Q1 and the P-channel MOSFETs Q2 and Q11. Accordingly, when the signal output by the NAND gate circuit G1 goes low, the N-channel MOSFET Q1 is turned off immediately. With the signal output by the NAND gate circuit G1 set to a low level, however, the P-channel MOSFETs Q2 and Q11 are turned on. Later on, after a predetermined delay time has lapsed, the P-channel MOSFETs Q10 and Q3 are also turned on. In this way, the P-channel MOSFETs Q2, Q3, Q10 and Q11 are all in a conducting state. At that time, however, the N-channel MOSFET Q1 has already been turned off. Accordingly, a direct current is by no means consumed through the N-channel MOSFET Q1.

A signal VB obtained through CMOS inverter circuits N2 and N5 from the signal output by the NAND gate circuit G1 is supplied to a CMOS inverter circuit N3 whose rise time from a low level to a high level is lengthened because the CMOS inverter circuit N3 is driven by the operation voltage VCC through a resistor R1. A delay capacitor C1 is connected to the output terminal of the CMOS inverter circuit N3. When a signal VB supplied to the CMOS inverter circuit N3 changes from the high level to the low level, a signal output by the inverter N3 is raised from the low level to the high level over a rise time prolonged by the resistor R1 in conjunction with a P-channel MOSFET of the CMOS inverter circuit N3 and the capacitor C1. The output signal of the CMOS inverter circuit N3 delayed in this way is supplied to the gate of the P-channel MOSFET Q3 as an input signal VC2 through a CMOS inverter circuit N4. The signal output by the NAND gate circuit G1 is supplied directly to the gate of the P-channel MOSFET Q2 which is connected in series to the P-channel MOSFET Q3. Accordingly, when the signal output by the NAND gate circuit G1 goes low, the P-channel MOSFET Q2 is turned on but the turning-on of the P-channel MOSFET Q3 lags behind that of the MOSFET Q2 because the signal VC2 supplied to the gate of the P-channel MOSFET Q3 by the CMOS inverter circuit N4 is delayed by a delay circuit introducing the prolonged rise time as described above. However, the low-level signal VB is supplied to the gate of the P-channel MOSFET Q10 prior to the feeding of the signal VC2 to the gate of the P-channel MOSFET Q3.

The output MOSFET Q7 is turned on by the driving circuit described above as follows. A gate voltage VE is raised by a circuit which comprises the P-channel MOSFETs Q10 and Q11 each having a small conductance and the resistor R3 connected to the capacitance of the gate of the output MOSFET Q7. Since the time constant of the circuit has a relatively large value, at a first stage, the gate voltage VE is raised gradually. After the time delay determined by the delay circuit described above has lapsed, however, the P-channel MOSFET Q3 is also turned on, resulting in a series circuit with the P-channel MOSFET Q2 connected in parallel to the series circuit comprising the P-channel MOSFETs Q10 and Q11. The conductances of the P-channel MOSFETs Q2 and Q3 are added in parallel to those of the P-channel MOSFETs Q10 and Q11 to give a larger total conductance and, thus, a shortened rise time of the gate voltage VE.

Much like the output MOSFET Q7, the gate of the output MOSFET Q8 for generating a high-level output signal is connected to a resistor R4 which forms a time-constant circuit in conjunction with the gate capacitance of the output MOSFET Q8. The value of the time constant of the circuit is fixed regardless of the load connected to the output terminal OUT. The time-constant circuit, the time constant of which is independent of the output load, is connected to the other driving circuit whose conductance also gradually varies with the lapse of time. That is to say, the output MOSFET Q8 for generating a low-level output signal is provided with a driving circuit comprising a CMOS inverter circuit N5, an N-channel MOSFET Q4 and P-channel MOSFETs Q5, Q6, Q12 and Q13.

In order to prevent through current from flowing through the MOSFETs Q4, Q5 and Q6 or the MOSFETs Q4, Q12 and Q13, they are connected in the following configuration. A signal output by a NAND gate circuit G2 is supplied to the gates of the N-channel MOSFET Q4 and the P-channel MOSFETs Q5 and Q13. Accordingly, when the signal output by the NAND gate circuit G2 goes low, the N-channel MOSFET Q4 is turned off immediately. With the signal output by the NAND gate circuit G2 set to a low level, however, the P-channel MOSFETs Q5 and Q13 are turned on. Later on, after a predetermined delay time has lapsed, the P-channel MOSFETs Q12 and Q6 are also turned on. In this way, the P-channel MOSFETs Q5, Q6, Q12 and Q13 are all in a conducting state. At that time, however, the N-channel MOSFET Q4 has already been turned off. Accordingly, a direct current is by no means consumed through the N-channel MOSFET Q4.

A signal VA obtained through CMOS inverter circuits N8 and N9 from the signal output by the NAND gate circuit G2 is supplied to a CMOS inverter circuit N6 whose rise time from a low level to a high level is lengthened because the CMOS inverter circuit N6 is driven by the operation voltage VCC through a resistor R2. A delay capacitor C2 is connected to the output terminal of the CMOS inverter circuit N6. When the signal VA supplied to the CMOS inverter circuit N6 changes from the high level to the low level, the signal output by the inverter N6 is raised from the low level to the high level over a rise time prolonged by the resistor R2 in conjunction with a P-channel MOSFET of the CMOS inverter circuit N6 and the capacitor C2. The output signal of the CMOS inverter circuit N6 delayed in this way is supplied to the gate of the P-channel MOSFET Q6 as an input signal VC1 through a CMOS inverter circuit N7. The signal output by the NAND gate circuit G2 is supplied directly to the gate of the P-channel MOSFET Q5 which is connected in series to the P-channel MOSFET Q6. Accordingly, when the signal output by the NAND gate circuit G2 goes low, the P-channel MOSFET Q5 is turned on but the turning-on of the P-channel MOSFET Q6 lags behind that of the MOSFET Q5 because the signal VC1 supplied to the gate of the P-channel MOSFET Q6 by the CMOS inverter circuit N7 is delayed by a delay circuit introducing the prolonged rise time as described above. However, the low-level signal VA is supplied to the gate of the P-channel MOSFET Q12 prior to the feeding of the signal VC1 to the gate of the P-channel MOSFET Q6.

The output MOSFET Q8 is turned on by the driving circuit described above as follows. A gate voltage VD is raised by a circuit which comprises the P-channel MOSFETs Q12 and Q13 each having a small conductance and the resistor R4 connected to the capacitance of the gate of the output MOSFET Q8. Since the time constant of the circuit has a relatively large value, at a first stage, the gate voltage VD is raised gradually. After the time delay determined by the delay circuit described above has lapsed, however, the P-channel MOSFET Q6 is also turned on, resulting in a series circuit with the P-channel MOSFET Q5 connected in parallel to the series circuit comprising the P-channel MOSFETs Q12 and Q13. The conductances of the P-channel MOSFETs Q5 and Q6 are added in parallel to those of the P-channel MOSFETs Q12 and Q13 to give a larger total conductance and, hence, a shortened rise time of the gate voltage VD.

As described above, the output MOSFET Q7 is turned off before the output MOSFET Q8 is turned on by the data DO set at a high level. With the output enable signal DOC set at a high level, raising the data DO causes the MOSFET Q1 at the driving stage to enter an on state, pulling down the gate voltage VE of the output MOSFET Q7 to a low level at an early stage. At that time, lagging behind the signal output by the gate circuit G1, the signal VB changes to a low level, turning off the P-channel MOSFET Q2 with fast timing. Therefore, the direct current supplied through a series circuit comprising the P-channel MOSFETs Q3 and Q2 is cut off even if the P-channel MOSFET Q3 is kept in the on state untill a later time by the delay circuit described earlier. As a result, the fall time of the driving voltage VE can be shortened. In addition, the through current flowing through the MOSFET Q1 can also be prevented as well.

Similarly, when the output MOSFET Q7 is switched from an off state to an on state by the data DO set at a low level, the output MOSFET Q8 is turned off. Receiving the data DO set at a low level, the signal output by the NAND gate circuit G2 turns high, causing the MOSFET Q4 at the driving stage to enter an on state and, hence, pulling down the gate voltage VD of the output MOSFET Q8 to a low level at a relatively early stage. At that time, lagging behind the signal output by the gate circuit G2, the signal VA changes to a low level, turning off the P-channel MOSFET Q5 with fast timing. Therefore, the direct current supplied through a series circuit comprising the P-channel MOSFETs Q6 and Q5 is cut off even if the P-channel MOSFET Q6 is kept in the on state untill a later time by the delay circuit described earlier. As a result, the fall time of the driving voltage VD can be shortened. In addition, the through current flowing through the MOSFET Q4 can also be prevented as well.

Figure 6:
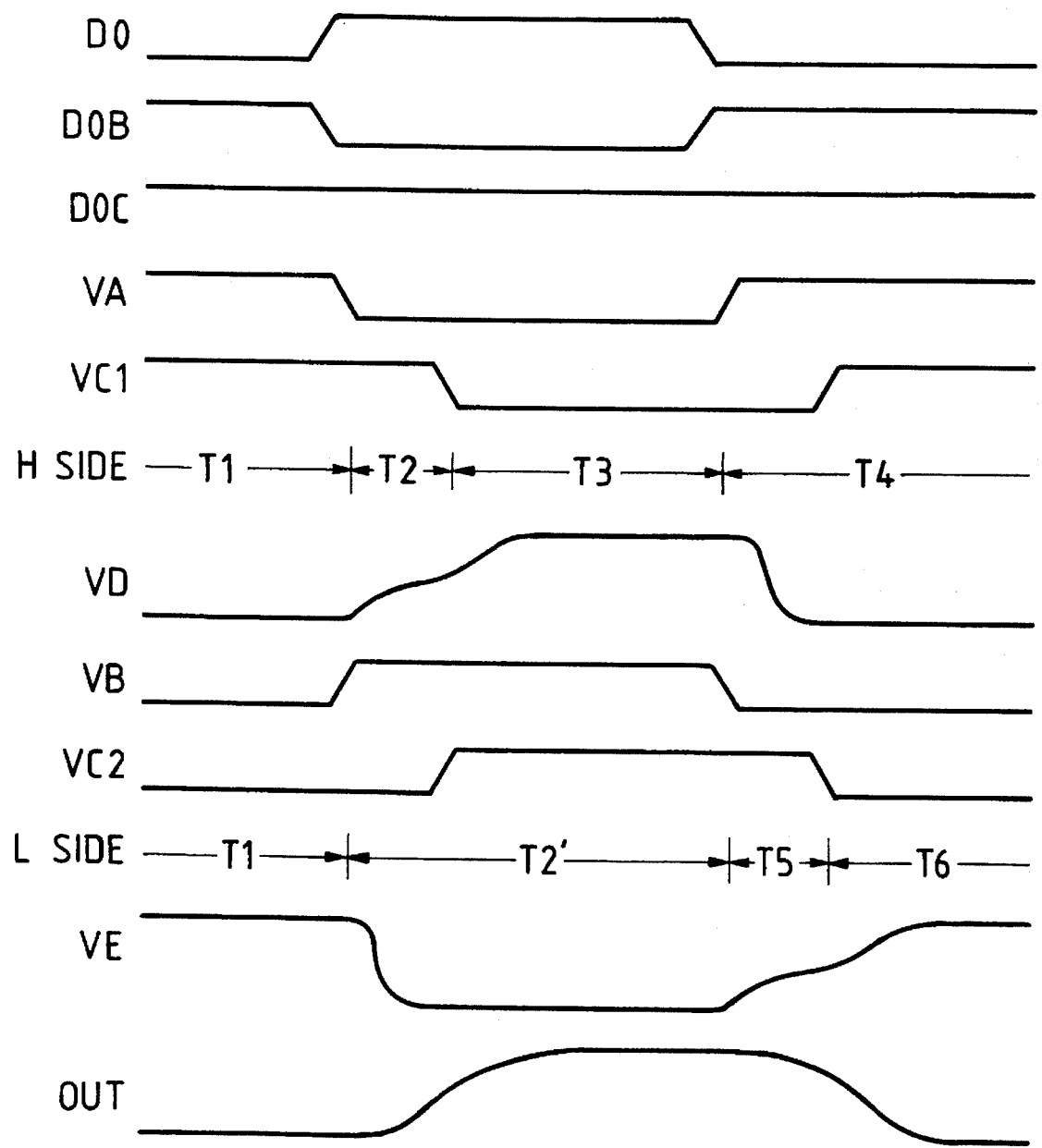
FIG. 6 shows operation wave forms used for explaining an operation example of the output circuit provided by the present invention.

FIG. 6 shows operation wave forms used for explaining an operation example of the output circuit provided by the present invention.

With the output enable signal DOC fixed at a high level, during a period T1 in which the data DO is low while the data DOB is high, the signals VA and VC1 of the driving circuit on the output high-level side H are high whereas the signals VB and VC2 of the driving circuit on the output low-level side L are low. At that time, the driving signals VD and VE are set at low and high levels respectively, pulling down the output terminal OUT to a low level.

Let the data DO go high and, thus, the data DOB go low. In the case of the embodiment shown in FIG. 1, the signal VB of the driving circuit on the L side goes high, turning on the N-channel MOSFET of the CMOS inverter circuit N5 and the N-channel MOSFET Q1 and, hence, pulling down the driving signal VE from a high level to a low level. At that time, the output MOSFET Q7 is thereby switched from an on state to an off state with fast timing.

As for the driving circuit on the H side, a period T2 starts on the falling edge of the signal VA and ends on the falling edge of the delayed signal VC1. During the period T2, driven only by a current supplied from the P-channel MOSFET of the CMOS inverter circuit N8, the signal VD rises gradually from a low level to a high level. With the P-channel MOSFET of the CMOS inverter circuit N8 created so as to give a relatively small conductance and with the values of the resistor R4 and the gate capacitance of the output MOSFET Q8 set so as to give a relatively large time constant, the driving signal VD rises merely at a slow speed. Accordingly, the rate, at which the output current varies when the voltage appearing at the output terminal OUT is changed from a low level to a high level, can be reduced to an extremely small value. As a result, the generation of power supply noise by, among other causes, an inductance component of wires of the power supply VCC can be suppressed.

The rise time of the driving voltage VD is determined only by the gate capacitance of the output MOSFET Q8, the gate input resistor R4 and the conductance of the P-channel MOSFET of the CMOS inverter circuit N8 as described above. The rise time is thus independent of the capacitance of a load connected to the output terminal OUT. Accordingly, power-supply noise can be suppressed to a minimum. In addition, the driving voltage VD can be controlled so that it rises with appropriate timing not slowing down the speed of the output signal.

At the beginning of a period T3, a period following the delay time T2 produced by the delay circuit, the driving voltage VD starts rising at a high speed because during the period T3, a current output by the P-channel MOSFETs Q5 and Q6 also contributes to the build-up of the driving voltage VD. The signal appearing at the output terminal OUT can thus be raised at a high speed as well.

On the L side, however, the driving voltage VE applied to the gate of the output MOSFET Q7 is at that time immediately pulled down at a high speed by the rising of the signal VB to a high level described above. Accordingly, the operation is not affected whatsoever even when the delayed signal VC2 is raised to a high level during a period T2' that follows.

Next, let the data DO go low and, thus, the data DOB go high. The signal VA of the driving circuit on the H side goes high, turning on the N-channel MOSFET of the CMOS inverter circuit N8 and the N-channel MOSFET Q4 and, hence, pulling down the driving signal VD from a high level to a low level. At that time, the output MOSFET Q8 is thereby switched from an on state to an off state with fast timing.

As for the driving circuit on the L side, a period T5 starts on the falling edge of the signal VG and ends on the falling edge of the delayed signal VC2. During the period T5, driven only by a current supplied from the P-channel MOSFET of the CMOS inverter circuit N5, the signal VE rises gradually from a low level to a high level. With the P-channel MOSFET of the CMOS inverter circuit N5 created so as to give a relatively small conductance and with the values of the resistor R3 and the gate capacitance of the output MOSFET Q7 set so as to give a relatively large time constant, the driving signal VE rises merely at a slow speed. Accordingly, the rate, at which the output current varies when the voltage appearing at the output terminal OUT is changed from a low level to a high level, can be reduced to an extremely small value. As a result, the generation of power-supply noise by, among other causes, an inductance component of wires of the power supply VCC can be suppressed.

The rise time of the driving voltage VE is determined only by the gate capacitance of the output MOSFET Q7, the gate input resistor R3 and the conductance of the P-channel MOSFET of the CMOS inverter circuit N5 as described above. The rise time is thus independent of the capacitance of a load connected to the output terminal OUT. Accordingly, grounding-wire and output-wire noise can be suppressed to a minimum. In addition, the driving voltage VE can be controlled so that it rises with appropriate timing not slowing down the speed of the output signal.

At the beginning of a period T6, a period following the delay time T5 produced by the delay circuit, the driving voltage VE starts rising at a high speed because during the period T6, a current output by the P-channel MOSFETs Q2 and Q3 also contributes to the build-up of the driving voltage VE. The signal appearing at the output terminal OUT can thus be raised at a high speed as well.

On the H side, however, the driving voltage VD applied to the gate of the output MOSFET Q8 is at that time immediately pulled down at a high speed by the rising of the signal VA to a high level described above. Accordingly, the operation is not affected whatsoever even when the delayed signal VC1 is raised to a high level during a period T4 that follows.

Figure 7:
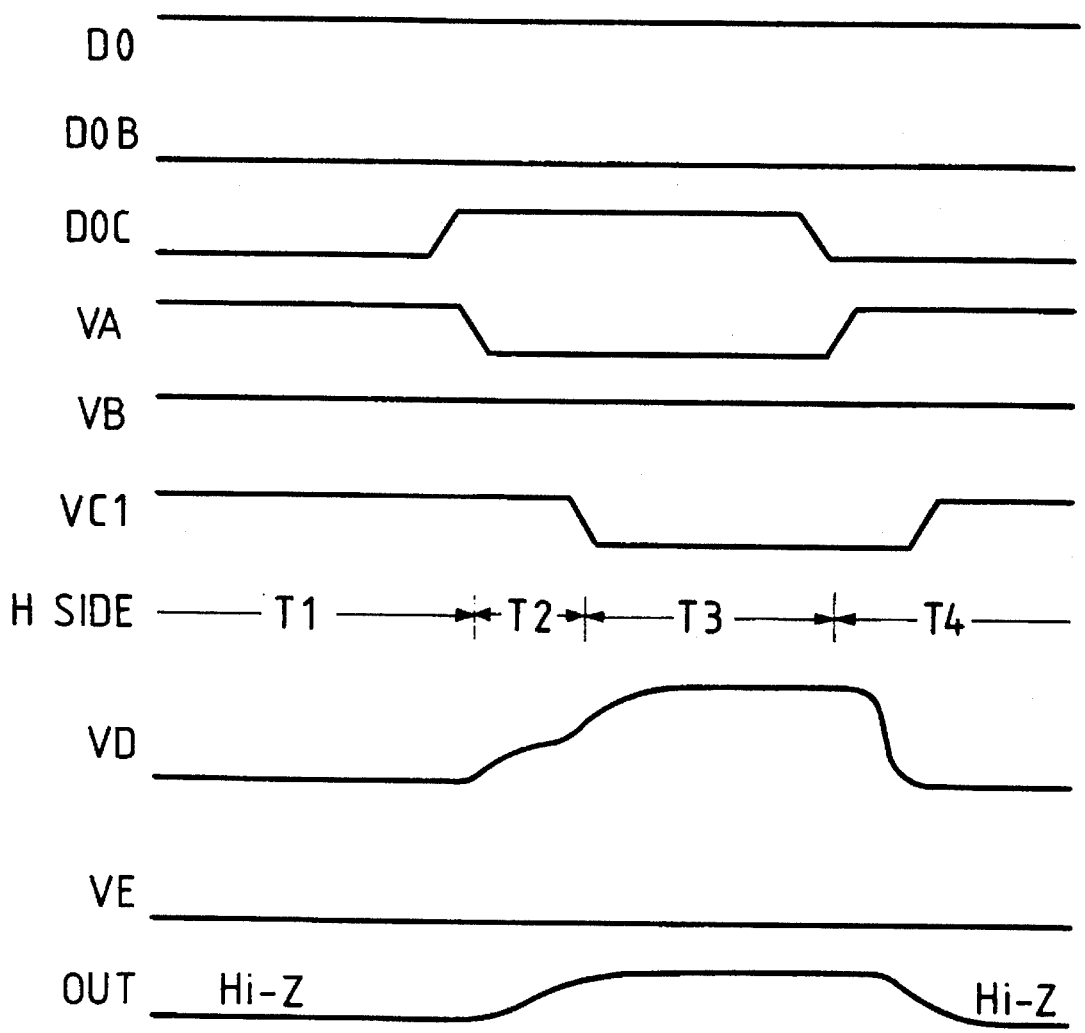
FIG. 7 shows operation wave forms used for explaining another operation example of the output circuit provided by the present invention.

FIG. 7 shows operation wave forms used for explaining another operation example of the output circuit provided by the present invention. The figure shows that in this embodiment, the output timing is controlled by the output enable signal DOC. In the example shown in the figure, a high-level output signal is generated from a high-impedance state.

During a period T1 in which the output enable signal DOC is low, the output terminal OUT displays a high impedance Hi-Z. The potential of the output terminal OUT is determined by, among other things, a load connected to it.

With the data DO set at a high level, or the data DOB set inversely to a low level, raising the output enable signal DOC to a high level causes the signal VA to go low. Thereafter, the CMOS inverter circuit N8 raises the driving voltage VD gradually during a period T2. During a period T3, the delayed signal VC1 is low, enabling the P-channel MOSFETs Q5 and Q6 to contribute to the rising of the driving signal VD and, hence, the output signal appearing at the output terminal OUT at a high speed.

When the output enable signal DOC goes low, the signal VA is raised to a high level accordingly. As described earlier, the driving signal VD is thereby pulled down to a low level at a high speed, causing the output terminal OUT to enter a high-impedance state and settle at a potential determined by, among other things, a load connected to it. The operations described above apply, almost as they are, to a case in which the data DO is set to a low level while the data DOB is set at a high level.

With the timing of the output signal determined only by the timing signal DOC, the timing signals TC1 and TC2 of the embodiment shown in FIG. 2 can be formed by delaying the timing signal DOC.

Figure 8:
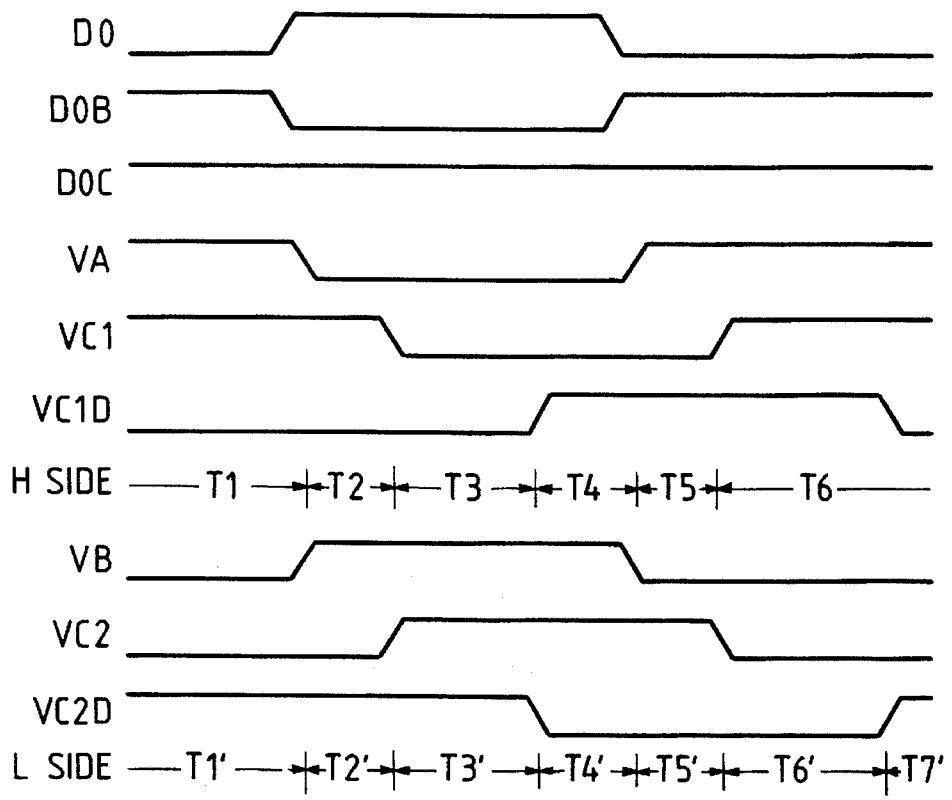
FIG. 8 shows operation wave forms used for explaining still another operation example of the output circuit provided by the present invention.

FIG. 8 shows operation wave forms used for explaining still another operation example of the output circuit provided by the present invention. The wave forms shown in FIG. 8 are an operation example for the embodiments shown in FIGS. 4 and 5. The driving conductance of the driving circuit on the H side of the embodiment shown in FIG. 4 is enlarged only during periods T3 and T6. During other periods, the driving signal VD is generated only by the CMOS inverter circuit which operates in a steady state. Likewise, the driving conductance of the driving circuit on the L side is enlarged only during periods T3' and T6'. During other periods, the driving signal VE is generated only by the CMOS inverter circuit which operates in a steady state.

Basically, the embodiment shown in FIG. 5 operates in the same way as that of FIG. 4. The embodiments are different from each other in that in the case of the former, the operations to pull down the driving signals VD and VE during periods T4 and T2' are executed at a higher speed by the N-channel MOSFET of the CMOS inverter circuit.

Figure 9:
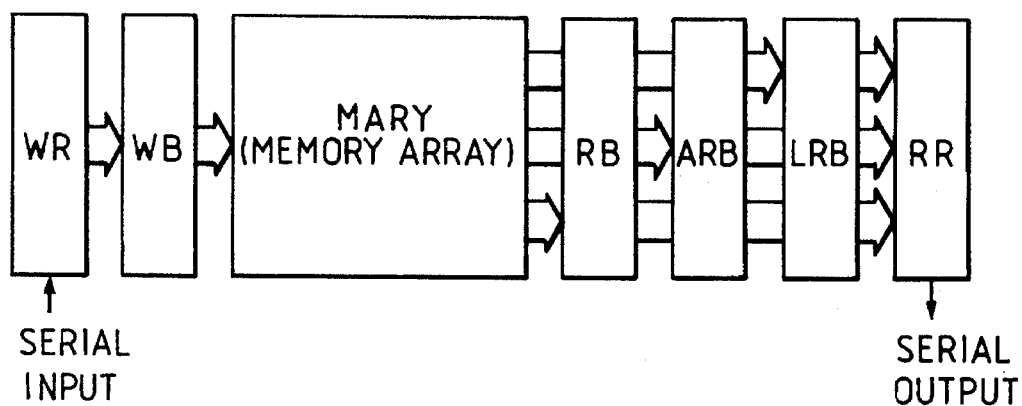
FIG. 9 is a block diagram of a typical semiconductor memory device to which the present invention is applied.

FIG. 9 is a block diagram of a typical semiconductor memory device to which the present invention can be applied. The embodiment shown in the figure implements a serial memory device, wherein circuit blocks are formed on a single semiconductor substrate typically made up of single crystal silicon using a widely known technology for manufacturing semiconductor integrated circuits.

In order to implement high-speed serial access, registers WR and RR are provided for write and read operations respectively. Data is written and read in parallel into and from a memory array MARY through the registers WR and RR respectively in units determined by the width of the registers. Serial data is input to the register WR from an external source and then undergoes serial-to-parallel conversion before being written into the memory array MARY. Conversely, data is read in parallel from the memory array MARY into the register RR and then undergoes parallel-to-serial conversion before being output serially from the register RR to the outside world. In this way, serial exchange of data with the outside world can be accomplished at a high speed as long as the time required for exchanging the data is not shorter than the cycle time required for internally reading or writing it from or into the memory array MARY.

In order to allow serial access of data to be executed continuously, buffers RB and WB are provided for reading and writing operations respectively. The buffers WB and RB each have the same size as the registers WR and RR. While data is being output serially from the register RR to the outside world, next data is read from the memory array MARY into the buffer RB. Likewise, data previously written into the register WR is transferred into the buffer WB and then while next serial data from an external source is being written into the register WR, the data transferred into the buffer WB is written in parallel into the memory array MARY. In this way, the serial access of data can be executed continuously without interruption.

In order to carry out window scanning continuously, a means that allows jump and line-set operations to be performed without a wait time is required. Since jump and line-set addresses are arbitrary, a special register having a fixed address such as a register for zero reset is not applicable. In this embodiment, a special A-read buffer ARB for a jump operation and a special L-read buffer LRB for a line-set operation are employed as shown in FIG. 10.

The buffers ARB and LRB operate as follows. When a read-jump address is input from an external source, memory data of the address is read into the A-read buffer ARB. When data is written into an address set as a read-jump address, the most recently written data is read into the A-read buffer ARB.

When a line-reset (including a result of internal increment), jump or reset operation is performed, the start address of a line following a line for starting access after the reset is read into the L-read buffer LRB. When data is written into the start address of a line following a line currently being read, the most recent data is read into the L-read buffer LRB. As for the operation to write data, the same means as that for ordinary addresses is used for writing the data into the memory array MARY.

Figure 10:
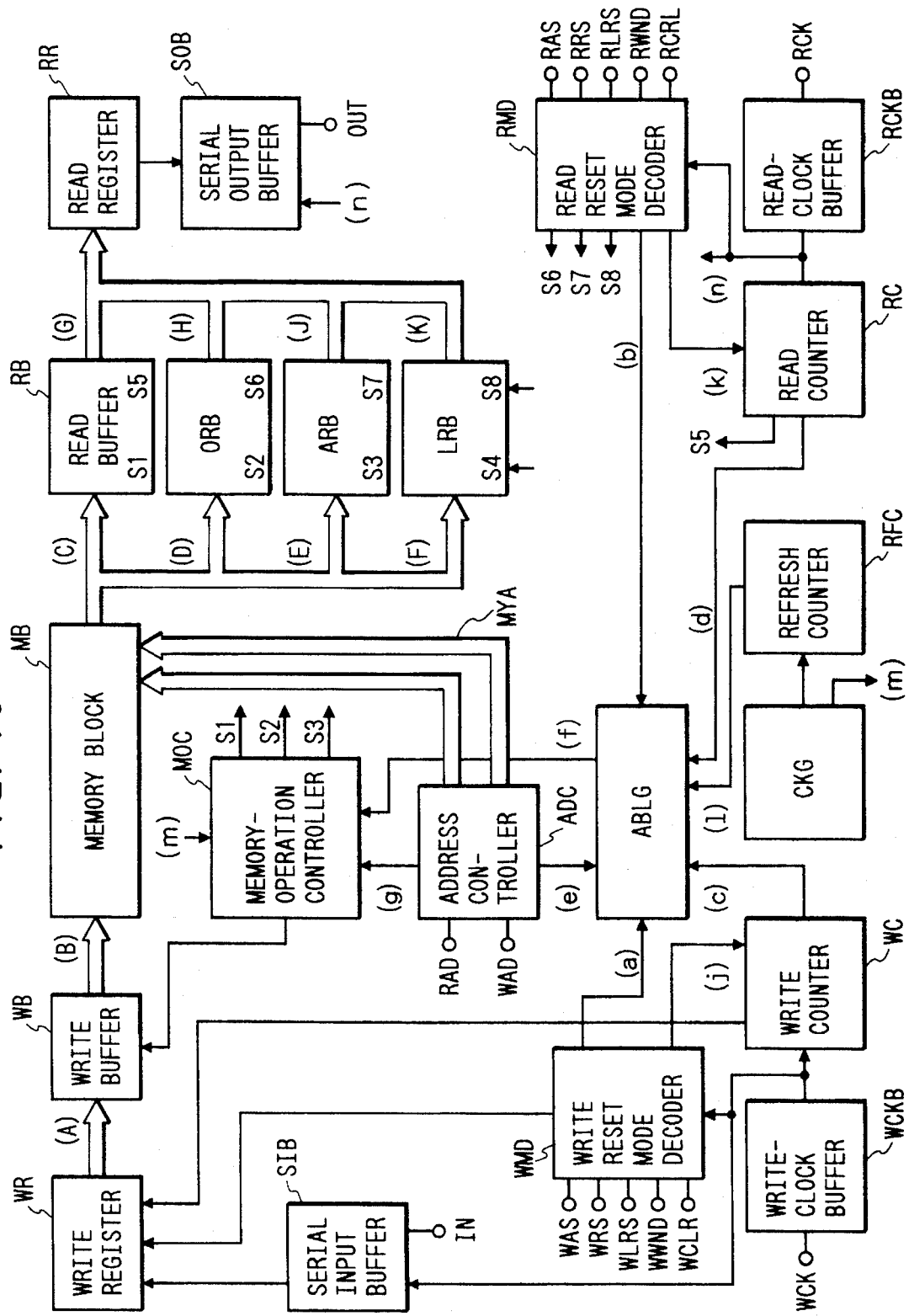
FIG. 10 is an overall block diagram of an embodiment of a serial memory device having a window-scan function to which the present invention is applied.

FIG. 10 is an overall block diagram of an embodiment of a serial memory device having a window-scan function to which the present invention is applied.

A serial input buffer SIB is used for storing data to be written which is being input serially in accordance with a write clock WCK. The data is then forwarded to a write register WR. The write register WR converts the data taken in through the serial input buffer SIB into 32-bit parallel data units which are transferred to a write buffer WB. The write register WR can be a shift register. As an alternative, the write register WR can also be a circuit for executing the same functions as a shift register, wherein a signal output by a counter counting the number of write clocks WCK is decoded by a decoder into a select signal for selecting a latch circuit.

The write buffer WB comprises 32 latch circuits for receiving data in parallel to be written in 32-bit units. Driven by a write/load signal generated by a write reset mode decoder WMD or a write counter WC, the latch circuits receive data to be written from the write register WR in parallel. The data received by the latch circuits is then output by a write-data transfer signal generated by a memory-operation controller MOC. In this way, the data is written in parallel into a memory block MB in 32-bit units.

Figure 11:
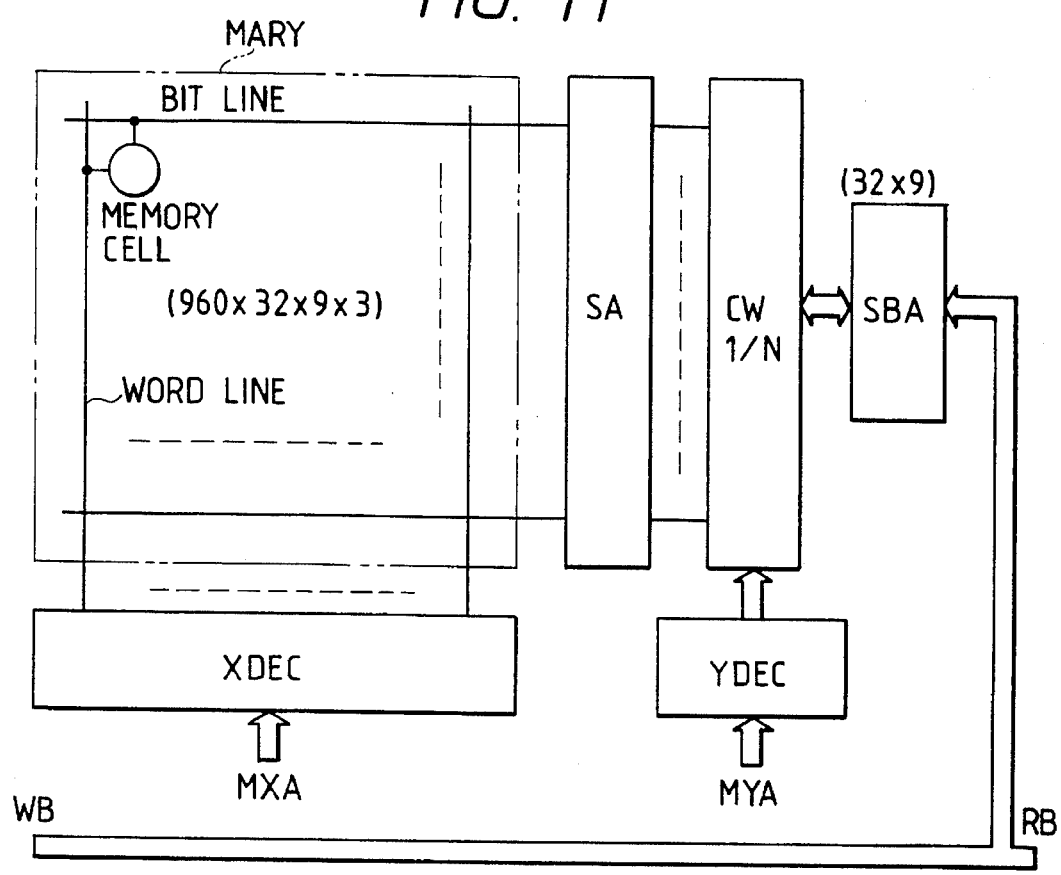
FIG. 11 is an actual configuration diagram of an internal portion of an embodiment implementing a memory block of the serial memory device shown in FIG. 10.

FIG. 11 is an actual configuration diagram of an internal portion of an embodiment implementing the memory block MB of the serial memory device shown in FIG. 10. As shown in the figure, the memory block MB comprises a memory array MARY, a sense amplifier SA, a decoder circuit YDEC, a column switch circuit CW, a sub-sense amplifier SBA and another decoder circuit XDEC. The memory array MARY is typically an ordinary dynamic RAM. The decoder circuit YDEC decodes a Y address MYA in order to generate a select signal used by the column switch circuit CW for carrying out 1/N selection of bit lines. The sub-sense amplifier SBA is used for forcibly inverting the sense amplifier SA in accordance with data to be written in an operation to write the data into the memory array MARY. Decoding an X address MXA, the decoder circuit XDEC generates a select signal for selecting a word line. The 1/N selection of bit lines is carried out for selecting a total of 32×9-bit data. In actuality, one memory array MARY comprises 960 word lines and 32×9×3 bit lines and there are a total of 3 mats ×3 in the memory array MARY. Accordingly, for each memory mat (memory array), the column switch CW performs ⅑ selection in 3-bit units. Much like the memory mats MARY, a total of three sub-sense amplifier units SBA exist. One side of the sub-sense amplifier SBA is connected to the write buffer WB through an internal data bus. The other side is connected to a read buffer RB to be described later. With the memory configuration described above, three bits can be assigned to each of the primary colors: red, green and blue, which constitute pixel data, to result in a multi-color screen capable of displaying 512 colors different from pixel to pixel.

The read buffer RB shown in FIG. 10 receives 32-bit data in parallel. The read buffer RB is thus used for storing data to be output next serially by a read register RR. To be more specific, while the read register RR is outputting 32-bit data serially, the read buffer RB receives data in parallel from the memory block MB which is to be output next in series by the output register RR as described above. Driven by a signal S1 generated by the memory-operation controller MOC, the read buffer RB takes in 32-bit data in parallel from the memory block MB. The data is then transferred in parallel from the read buffer RB to the read register RR by a read load signal S5 generated by a read counter RC. In actuality, since the data is output serially in 9-bit units, the number of read buffers RB required is nine. Accordingly, nine output circuits each shown in FIG. 1 are required in order to implement a complete output circuit in accordance with the present invention.

The A-read buffer ARB is used for keeping data to be output from the read register RR in the event of an address jump. Data is read into the A-read buffer ARB by a signal S3 generated by the memory-operation controller MOC when:

1. The setting of a read jump is changed by a signal b produced by a read set mode decoder RMD.
2. Data is written at a set read-jump address by a signal e produced by an address controller ADC.

Data is transferred from the A-read buffer ARB to the read register RR by a read load signal S7 generated by the read reset mode decoder RMD. Serial data can thus be output from a specified address without a wait time when the jump or window mode is specified.

An O-read buffer ORB is used for keeping O-address data. Data is read into the O-read buffer ORB by a signal S2 generated by the memory-operation controller MOC. Data is transferred from the O-read buffer ORB to the read register RR by a read load signal S6 generated by the read reset mode decoder RMD. Serial data can thus be output from the start address 0,0 without a wait time when setting the operation to the start address.

An L-read buffer LRB is used for keeping data to be output from the read register RR in the event of a line set. Data is read into the L-read buffer LRB by a signal S4 generated by the memory-operation controller MOC when:

1. A line address is changed during a read operation by a 0 reset, a line reset or a jump. In this case,. data is to be read from the start address of the next line after the line address is changed.
2. Data at an address on the next line is overwritten by a write operation while data at an address on a current line is being output from the read register RR. Data is transferred from the L-read buffer LRB to the read register RR by a read load signal S8 generated by the read reset mode decoder RMD. Serial data can thus be output from the start address of the next line without a wait time when a line-reset operation is performed.

The read register RR converts 32-bit data received in parallel from the read buffer RB into serial one. The parallel data is read by the read register RR with timing determined by the signals S5 to S8.

A serial output buffer SOB synchronizes the operation to output data in series by using an internal clock n which is input through a read clock buffer RCKB.

Decoding a control signal received through an external terminal, a write reset mode decoder WMD selects a reset mode, in which a signal requesting a memory operation is transmitted to a read/write/refresh arbitration logic circuit ABLG and a timing signal for loading data from the write register WR into the write buffer WB is generated.

Decoding a control signal received through an external terminal, the read reset mode decoder RMD selects a reset mode, in which one of the signals S6 to S8 is selected and activated and a signal requesting an operation to read data from the memory block MB into the read buffer RB, the A-read buffer ARB and the L-read buffer LRB is transmitted to the read/write/refresh arbitration logic circuit ABLG.

Receiving the write clock signal WCK supplied from an external source, a write clock buffer WCKB generates an internal write clock signal which is counted by a write counter WC counting up to 32 bits. The write counter WC generates a load signal each time 32 bits are counted. At that time, the load signal transfers 32-bit data stored in the write register WR into the write buffer WB in parallel. In addition, the write counter WC also transmits a request signal e to the read/write/refresh arbitration logic circuit ABLG. The signal e requests an operation to write the data loaded in the write buffer WB into the memory block MB of the memory array. The write counter WC is reset by a reset signal j which is generated by the write set mode decoder RMD when the operation mode described above is selected.

Receiving the read clock signal RCK supplied from the external source, the read clock buffer RCKB generates an internal read clock signal which is counted by a read counter RC counting up to 32 bits to detect the end of serial transmission of the 32-bit data. The read counter RC activates a read load signal S5 each time 32 bits are counted. The read load signal S5 transfers 32-bit data stored in the read buffer RB into the read register RR in parallel. In addition, the read counter WC also transmits a request signal d to the read/write/refresh arbitration logic circuit ABLG. The signal e requests an operation to read the data at an address next to the data transferred by the read load signal S5 from the memory array of the memory block MB to the read buffer RB. The read counter WC is reset by a reset signal k which is generated by the read set mode decoder RMD when the operation mode described above is selected.

A refresh counter RFC counts the number of clocks generated by an internal clock generating circuit CKG in order to produce a signal 1 requesting refresh operations periodically at required intervals. The signal 1 is transmitted to the read/write/refresh arbitration logic circuit ABLG. The internal clock generating circuit CKG includes an oscillation circuit which operates all the time as long as the power supply is turned on. The internal clock generating circuit CKG outputs a memory-refresh clock signal.

The read/write/refresh arbitration logic circuit ABLG receives the memory-operation requesting signals a, b, c, d and 1 from the write reset mode decoder WMD, the read reset mode decoder RMD, the write counter WC, the read counter RC and the refresh counter RFC respectively. In addition, the read/write/refresh arbitration logic circuit ABLG also receives the memory-operation requesting signal e from the address controller ADC to be described in more detail later. The read/write/refresh arbitration logic circuit ABLG assigns priorities to the memory-operation requesting signals in order to determine a sequence according to which memory operations are to be requested, transmitting a memory-operation specifying signal f to the memory-operation controller MOC and the address controller ADC.

Receiving the memory-operation specifying signal f transmitted by the read/write/refresh arbitration logic circuit ABLG, the address controller ADC computes a required address, transmitting a corresponding address signal g to the memory-operation controller MOC. The address controller ADC compares a read-jump address, which is set as a write address, to the start address of a next line following a line currently being read serially. If the the address controller ADC finds out that the former address is equal to the latter, the memory-operation requesting signal e is transmitted to the read/write/refresh arbitration logic circuit ABLG to:

1. re-read data E from the read-jump address in the memory array of the memory block MB into the A-read buffer ARB and
2. re-read data F from the start address of the next line following a line currently being read serially in the memory array of the memory block MB into the L-read buffer LRB.

The address controller ADC monitors read and write addresses to determine if they are a line end address or a screen end address. If a line end address is detected, a signal is generated to request a read/write operation required for an internal automatic reset. If a screen end address is detected, a signal e is generated to request a read/write operation required for an internal automatic line reset. Both the requesting signals are transmitted to the read/write/refresh arbitration logic circuit ABLG.

Receiving the memory-operation specifying signal f transmitted by the read/write/refresh arbitration logic circuit ABLG and the address signal g from the address controller ADC, the memory-operation controller MOC controls memory operations (1) to (8) listed below:

(1) Operation of the X decoder XDEC (2) Activation of a word-line (3) Operation of the sense amplifier SA (4) Operation of the Y decoder YDEC (5) Activation of the column switch SW (6) Operation of the sub-sense amplifier SBA (7) Selection of a signal among the data transfer signals S1 to S3 by means of the signal f and activation of required timing (No activation for a refresh operation)

(8) Precharge operation

The output circuits shown in FIGS. 1 to 5 are applicable to the serial memory described above. Noise generated during the operation of such a serial output circuit may be treated by mistake by an input buffer, which receives serial-read clock pulses RCK or serial-write clock pulses WCK supplied by an external source, as clock pulses. The noise thus increments the contents of an address counter mistakenly, inadvertently shifting the entire picture arrays. As a result, the picture being displayed is virtually destroyed. By using the output circuit of one of the above embodiments, however, output noise and power-supply wire noise can be suppressed to a minimum. Accordingly, stable picture processing operation can be carried out even if nine output circuits are used simultaneously.

Effects obtained from the embodiments described above are listed as follows:

(1) In the driving circuits for generating the driving signals for controlling the first output element employed in the output circuit for generating a high-level output signal and the second output element employed in the output circuit for generating a low-level output signal by switching the first and second output elements on and off in a mutually complementary manner, each of the driving circuits is controlled so that the conductance thereof increases gradually, allowing the rates of change of the driving signals to be controlled in a smooth and stable manner and, hence, output currents to be changed smoothly to result in high-speed operation of an output signal with a reduced amount of noise.

(2) The rates of change of the driving signals generated in the driving circuits can be changed smoothly to give stable operation of the output signal which is determined only by the gate capacitances of the output MOSFETs, the resistances of the gate resistors and the conductances of the driving circuits and not affected by a load connected to the output terminal.

(3) Since the driving circuits are separated from each other and the rates of change of the driving signals can be made smooth, the circuits can be designed by using MOSFETs having small sizes to give high integration in comparison to a method of splitting the output MOSFETs.

(4) The conductances of the driving circuits are increased gradually by using signals delayed after data to be output in order to raise the driving signals smoothly and the conductances of the driving circuits are increased immediately by directly using the data to be output in order to pull down the driving signals so as to allow direct currents at the output stage as well as noise to be reduced.

(5) By employing the output circuit in a serial memory device read and written serially using clock pulses, noise generated at variation timing of the output signal can be reduced considerably so that erroneous address incrementing operations can be avoided and screen data can thus be stored in a stable state.

The present invention proposed by the inventors has become apparent from the above description of the embodiments in concrete terms. However, applications of the present invention are not limited to the embodiments. That is, it is needless to say that a variety of modifications are possible as long as they are within a scope not deviating from the gists of the present invention. For example, the circuit shown in FIG. 1 may be reconfigured by exchanging the P-channel MOSFETs Q2 and Q3 with the MOSFETs Q5 and Q6. In addition, the input resistors connected to the gates of the output MOSFETs can be eliminated. As an alternative, fixed resistors may be inserted into the P-channel MOSFETs of the CMOS inverter circuits replacing the input resistors. In the embodiments described above, the driving stage is split into two driving circuits. In addition, the CMOS inverter circuits N5 and N8 of the embodiment shown in FIG. 1, which operate in a steady state, each determine a first-stage conductance. The pair of P-channel MOSFETs Q2 and Q3 and the pair of P-channel MOSFETs Q5 and Q6 each determine a second-stage conductance. The same P-channel MOSFETs can be further added in parallel to give a third-stage conductance so as to allow the conductance at the driving stage to be further fine-controlled. The additional P-channel MOSFETs can also be incorporated in the embodiments shown in FIGS. 2 to 5 as well.

Instead of a MOSFET, a bipolar transistor can also be employed as the output element. As an alternative, a combination of a bipolar transistor and a MOSFET may also be used as well. If the tri-state output function at the output stage is not used, the output enable signal DOC and the NAND and NOR gate circuits controlled by the output enable signal DOC are not required. The delay circuits DLY, DLY1 and DLY2 can be implemented into the same actual configuration shown in the embodiment of FIG. 1. In addition, they can each be designed into a variety of implementations such as a combination of a delay circuit, which comprises a resistive element and a capacitor, and an inverter circuit.

The output circuit provided by the present invention can be applied not only to the serial memory described above, but also to a wide variety of semiconductor integrated-memory devices such as dynamic RAMs, static RAMs, read-only memory ROM devices and digital-data processing devices including microprocessors.

Effects obtained from representative innovations disclosed in this specification are briefly described as follows.

In the driving circuits for generating the driving signals for controlling the first output element employed in the output circuit for generating a high-level output signal and the second output element employed in the output circuit for generating a low-level output signal by switching the first and second output elements on and off in a mutually complementary manner, each of the driving circuits is controlled so that the conductance thereof increases gradually, allowing the rates of change of the driving signals to be controlled in a smooth and stable manner and, hence, output currents to be changed smoothly to result in high-speed operation of an output signal with a reduced amount of noise.

What is claimed is:

1. A semiconductor integrated circuit device comprising:

a first MOSFET having a source-drain path provided between a first voltage terminal and an output terminal;

a second MOSFET having a source-drain path provided between said first voltage terminal and said gate of said first MOSFET and supplying a first drive signal to said gate of said first MOSFET in response to a first control signal;

a third MOSFET having a source-drain path provided between said first voltage terminal and said gate of said first MOSFET and supplying a second drive signal to said gate of said first MOSFET in response to a second control signal;

a fourth MOSFET having a source-drain path connected to said source-drain path of said third MOSFET in series;

an input terminal for receiving a control input signal coupled to a gate of said second MOSFET; and, a first delay circuit provided between said input terminal and a gate of said third MOSFET;

wherein one of said first and second drive signals is supplied to said gate of said first MOSFET during a period;

wherein, following to said period, both of said first and second drive signals are so supplied to said gate of said first MOSFET that conductance of said first MOSFET increases; and, wherein a gate of said fourth MOSFET is connected to said gate of said second MOSFET.

2. A semiconductor integrated circuit device according to claim 1, further comprising a fifth MOSFET having a source-drain path provided between a second voltage terminal and said gate of said first MOSFET and having a gate coupled to said gate of said second MOSFET.

3. A semiconductor integrated circuit device according to claim 2, wherein said first and fifth MOSFETs are N-channel MOSFETs and said second, third and fourth MOSFETs are P-channel MOSFETs.

4. A semiconductor integrated circuit device according to claim 3, wherein:

a voltage level of said first voltage terminal corresponds to a high level; and a voltage level of said second voltage terminal corresponds to a low level.

5. A semiconductor integrated circuit device according to claim 4, further comprising:

a P-channel sixth MOSFET having a source-drain path provided between a drain of said second MOSFET and said gate of said first MOSFET; and a second delay circuit provided between a gate of said sixth MOSFET and said gate of said second MOSFET.

6. A semiconductor integrated circuit device comprising:

a first MOSFET having a source-drain path provided between a first voltage terminal and an output terminal;

a second MOSFET having a source-drain path provided between a second voltage terminal and said output terminal;

a third MOSFET having a source-drain path provided between said first voltage terminal and said gate of said first MOSFET and supplying a first drive signal to said gate of said first MOSFET in response to a first control signal;

a fourth MOSFET having a source-drain path provided between said first voltage terminal and said gate of said first MOSFET and supplying a second drive signal to said gate of said first MOSFET in response to a second control signal;

a fifth MOSFET having a source-drain path provided between said first voltage terminal and said gate of said second MOSFET and supplying a third drive signal to said gate of said second MOSFET in response to a third control signal;

a sixth MOSFET having a source-drain path provided between said first voltage terminal and said gate of said second MOSFET and supplying a fourth drive signal to said gate of said second MOSFET in response to a fourth control signal;

a seventh MOSFET having a source-drain path connected to said source-drain path of said fourth MOSFET in series;

a first input terminal for receiving a first control signal coupled to a gate of said third MOSFET;

a second input terminal for recieving a second control input signal coupled to a gate of said fifth MOSFET;

a first delay circuit provided between said first input terminal and a gate of said fourth MOSFET; and, a second delay circuit provided between said second input terminal and a gate of said sixth MOSFET;

wherein one of said first and second drive signals is supplied to said gate of said first MOSFET during a first period;

wherein, in a second period following to said first period, both of said first and second drive signals are so supplied to said gate of said first MOSFET that said conductance of said first MOSFET increases;

wherein, in said first and second periods, said second MOSFET is in an off state;

wherein one of said third and fourth drive signals is supplied to said gate of said second MOSFET in a third period;

wherein, in a fourth period following to said third period, both of said third and fourth drive signals are so supplied to said gate of said second MOSFET that conductance of said second MOSFET increases;

wherein in said third and fourth periods, said first MOSFET is in an off state; and, wherein a gate of said seventh MOSFET is connected to said gate of said third MOSFET.

7. A semiconductor integrated circuit device according to claim 6, further comprising an eighth MOSFET having a source-drain path provided between said second voltage terminal and said gate of said first MOSFET and having a gate coupled to said gate of said third MOSFET.

8. A semiconductor integrated circuit device according to claim 7, further comprising:

a ninth MOSFET having a source-drain path connected to said source-drain path of said sixth MOSFET in series, wherein a gate of said ninth MOSFET is connected to said gate of said fifth MOSFET.

9. A semiconductor integrated circuit device according to claim 8, further comprising a tenth MOSFET having a source-drain path provided between said second voltage terminal and said gate of said second MOSFET and having a gate coupled to said gate of said fifth MOSFET.

10. A semiconductor integrated circuit device according to claim 9, wherein said first, second, eighth and tenth MOSFETs are N-channel MOSFETs and said third, fourth, fifth, seventh, sixth, and ninth MOSFETs are P-channel MOSFETs.

11. A semiconductor integrated circuit device according to claim 10, wherein:

a voltage level of said first voltage terminal corresponds to a high level; and a voltage level of said second voltage terminal corresponds to a low level.

12. A semiconductor integrated circuit device according to claim 11, wherein said first control input signal supplied to said gate of said third MOSFET and said second control input signal supplied to said gate of said fifth MOSFET have different logic levels each other during said first, second, third and fourth periods.

13. A semiconductor integrated circuit device according to claim 12, wherein said first and second input signals have the same logic levels so that said first and second MOSFETs are in off states during a fifth period.

14. A semiconductor memory device comprising:

a first MOSFET having a source-drain path provided between a first voltage terminal and an output terminal;

a second MOSFET having a source-drain path provided between a second voltage terminal and said output terminal;

a third MOSFET having a source-drain path provided between said first voltage terminal and said gate of said first MOSFET;

a fourth MOSFET having a source-drain path provided between said first voltage terminal and said gate of said first MOSFET and having a gate receiving a first delay signal delayed from a first input signal supplied to said gate of said third MOSFET;

a fifth MOSFET having a gate coupled to said gate of said third MOSFET and having a source-drain path coupled to said source-drain path of said fourth MOSFET in series;

a sixth MOSFET having a source-drain path provided between said second voltage terminal and said gate of said first MOSFET and having a gate coupled to said gate of said third MOSFET;

a seventh MOSFET having a source-drain path provided between said first voltage terminal and said gate of said second MOSFET;

an eighth MOSFET having a source-drain path provided between said first voltage terminal and said gate of said second MOSFET and having a gate receiving a second delay signal delayed from a second input signal supplied to said gate of said seventh MOSFET;

a ninth MOSFET having a gate coupled to said gate of said seventh MOSFET and having a source-drain path coupled to said source-drain path of said eighth MOSFET in series;

a tenth MOSFET having a source-drain path provided between said second voltage terminal and said gate of said second MOSFET and having a gate coupled to said gate of said seventh MOSFET; and wherein said first, second, sixth and tenth MOSFETs are N-channel MOSFETs and said third, fourth, fifth, seventh, eighth and ninth MOSFETs are P-channel MOSFETs.

15. A semiconductor integrated circuit device according to claim 14, wherein said first and second input signals have different logic levels each other in a first period so that one of said first and second MOSFETs is in an on state while the other is in an off state.

16. A semiconductor integrated circuit device according to claim 15, wherein said first and second input signals have the same logic levels in a second period so that said first and second MOSFETs are in off states.

17. A semiconductor integrated circuit device comprising:

a first MOSFET having a source-drain path provided between a power supply potential and an output terminal;

a second MOSFET having a source-drain path provided between said power supply potential and the gate of said first MOSFET and supplying a first drive signal to said gate of said first MOSFET;

a third MOSFET having a source-drain path provided between said power supply potential and said gate of said first MOSFET and supplying a second drive signal to said gate of said first MOSFET;

a fourth MOSFET having a source-drain path provided between said gate of said first MOSFET and a ground potential; and, a delay circuit for delaying a control input signal having an input terminal coupled to gates of said second and fourth MOSFETs and an output terminal coupled to the gate of said third MOSFET;

wherein, in a first period defined by said delay circuit, said second MOSFET is in an ON state and said third MOSFET is in an OFF state;

wherein, in a second period following said first period, both said second and third MOSFETs are in the ON state; and, wherein, in both said first and second periods, said fourth MOSFET is in the OFF state.

18. A semiconductor integrated circuit device according to claim 17, further comprising:

a fifth MOSFET having a source-drain path connected to said source-drain path of said third MOSFET in series;

wherein a gate of said fifth MOSFET is connected to said gate of said second MOSFET.

* * * * *